(12) United States Patent
Haass et al.

(10) Patent No.: US 8,472,278 B2
(45) Date of Patent: Jun. 25, 2013

(54) CIRCUITS, SYSTEMS AND METHODS FOR ADJUSTING CLOCK SIGNALS BASED ON MEASURED PERFORMANCE CHARACTERISTICS

(75) Inventors: Benjamin J. Haass, Raleigh, NC (US); William J. McAvoy, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 355 days.

(21) Appl. No.: 12/757,336

(22) Filed: Apr. 9, 2010

(65) Prior Publication Data
US 2011/0249525 A1    Oct. 13, 2011

(51) Int. Cl.
*G11C 8/00*    (2006.01)
(52) U.S. Cl.
USPC ........................................ 365/233.1
(58) Field of Classification Search
USPC ........................................ 365/233.1
See application file for complete search history.

(56) References Cited

U.S. PATENT DOCUMENTS

| | | |
|---|---|---|
| 4,099,125 A | 7/1978 | Bennett, Jr. et al. |
| 4,285,037 A | 8/1981 | Von Stetten |
| 4,691,124 A | 9/1987 | Ledzius et al. |
| 4,910,703 A | 3/1990 | Ikeda et al. |
| 5,347,558 A | 9/1994 | Nikjou |
| 5,357,206 A | 10/1994 | Ash |
| 5,410,263 A | 4/1995 | Waizman |
| 5,490,059 A | 2/1996 | Mahalingaiah et al. |
| 5,745,106 A | 4/1998 | Chandavarkar |
| 5,809,336 A | 9/1998 | Moore et al. |
| 5,875,464 A | 2/1999 | Kirk |
| 5,931,748 A | 8/1999 | Hsieh |
| 6,282,613 B1 | 8/2001 | Hsu et al. |
| 6,473,478 B1 | 10/2002 | Wallberg et al. |
| 6,577,915 B1 | 6/2003 | Cooperberg et al. |

(Continued)

FOREIGN PATENT DOCUMENTS

| | | |
|---|---|---|
| DE | 19540183 A1 | 4/1997 |
| EP | 0200355 A2 | 11/1986 |

(Continued)

OTHER PUBLICATIONS

International Search Report and Written Opinion—PCT/US2011/031244, ISA/EPO—Jul. 8, 2011.

(Continued)

*Primary Examiner* — Hoai V Ho
*Assistant Examiner* — Pablo Huerta
(74) *Attorney, Agent, or Firm* — Peter Michael Kamarchik; Nicholas J. Pauley; Joseph Agusta

(57) ABSTRACT

Circuits, systems, and related methods to measure a performance characteristic(s) associated with a semiconductor die and adjust a clock signal based on the measured performance characteristic(s) are provided. The adjusted clock signal can be used to provide a clock signal to a functional circuit provided in the semiconductor die to assure proper operation of the functional circuit while operating with performance, voltage, temperature (PVT) delay variations. In this regard, a performance monitoring circuit is provided in the semiconductor die that includes the functional circuit. As a result, the performance monitoring circuit may be exposed to similar delay variations as the functional circuit. The performance monitoring circuit is configured to measure a performance characteristic(s) associated with the semiconductor die. The performance characteristic(s) is used to adjust a clock signal to provide an adjusted clock signal to the functional circuit for proper operation based on the performance characteristic(s).

23 Claims, 12 Drawing Sheets

U.S. PATENT DOCUMENTS

| | | | |
|---|---|---|---|
| 6,674,331 | B2 | 1/2004 | McDowell |
| 6,975,099 | B2 | 12/2005 | Wu et al. |
| 7,023,672 | B2 | 4/2006 | Goodfellow et al. |
| 7,127,560 | B2 | 10/2006 | Cohen et al. |
| 7,164,264 | B2 | 1/2007 | Anderson et al. |
| 7,239,094 | B2 | 7/2007 | Radzinski et al. |
| 7,366,932 | B2 | 4/2008 | Rizzo et al. |
| 7,424,577 | B2 | 9/2008 | Bali et al. |
| 7,472,296 | B2 | 12/2008 | Kato et al. |
| 2002/0039318 | A1 | 4/2002 | Shirley |
| 2003/0201838 | A1 | 10/2003 | Tam et al. |
| 2003/0222535 | A1 | 12/2003 | Gofman et al. |
| 2005/0076253 | A1 | 4/2005 | Lu |
| 2005/0188230 | A1 | 8/2005 | Bilak |
| 2005/0204046 | A1 | 9/2005 | Watanabe |
| 2005/0223028 | A1 | 10/2005 | Geiner et al. |
| 2006/0186936 | A1 | 8/2006 | Cao |
| 2006/0186938 | A1 | 8/2006 | Cao |
| 2006/0190203 | A1 | 8/2006 | Cao |
| 2008/0120065 | A1 | 5/2008 | Joshi et al. |
| 2008/0129351 | A1 | 6/2008 | Chawla |
| 2008/0250361 | A1 | 10/2008 | Bae et al. |
| 2009/0019265 | A1 | 1/2009 | Correale, Jr. et al. |
| 2009/0327620 | A1 | 12/2009 | Arsovski et al. |
| 2011/0267096 | A1* | 11/2011 | Chlipala et al. ............ 326/16 |

FOREIGN PATENT DOCUMENTS

| | | |
|---|---|---|
| EP | 0722137 A1 | 7/1996 |
| EP | 0794481 A2 | 9/1997 |
| EP | 0871223 A1 | 10/1998 |
| FR | 2861428 A1 | 4/2005 |
| GB | 2080585 A | 2/1982 |
| JP | 2250681 A | 10/1990 |
| JP | 3166614 | 7/1991 |
| JP | 3209691 | 9/1991 |
| JP | 5341872 A | 12/1993 |
| JP | 7107286 A | 4/1995 |
| JP | 7209370 A | 8/1995 |
| JP | 8051774 A | 2/1996 |
| JP | 10247076 A | 9/1998 |
| JP | 11055360 A | 2/1999 |
| JP | 2002014175 A | 1/2002 |
| JP | 2002024155 A | 1/2002 |
| JP | 2002032265 A | 1/2002 |
| JP | 2002082904 A | 3/2002 |
| JP | 2002100491 A | 4/2002 |
| JP | 2004048729 A | 2/2004 |
| JP | 2004139366 A | 5/2004 |
| JP | 2004228417 A | 8/2004 |
| JP | 2004297982 A | 10/2004 |
| JP | 2004304869 A | 10/2004 |
| JP | 2005012340 A | 1/2005 |
| JP | 2005109618 A | 4/2005 |
| JP | 2006033488 A | 2/2006 |
| JP | 2006067462 A | 3/2006 |
| JP | 2006279392 A | 10/2006 |
| JP | 2006303928 A | 11/2006 |
| JP | 2007104203 A | 4/2007 |
| JP | 2007193433 A | 8/2007 |
| JP | 2008245134 A | 10/2008 |
| SU | 1021000 A1 | 5/1983 |
| TW | 298630 | 2/1997 |
| WO | WO9749212 A2 | 12/1997 |
| WO | WO9927646 A1 | 6/1999 |
| WO | WO2004088667 A1 | 10/2004 |
| WO | WO2005088424 A2 | 9/2005 |
| WO | WO2006073845 | 7/2006 |

OTHER PUBLICATIONS

45th IEEE International Midwest, Symposium on Circuits and Systems Conference Program, Aug. 4-7, 2002, Tulsa, Oklahoma, MWSCAS-2002, OSU Tulsa, p. 1-174.

Abe M et al., "New Technology Towards GaAs LSI/VLSI for Computer Applications", Microwave Theory and Techniques, IEEE Transactions on, vol. 30, Issue 7, 1982, p. 992-998.

Abstracts of Published in the Transaction of the KITE (Jan. 1993~Sep. 1993), KITE Journal of Electronics Engineering vol. 4 No. 1, date 1993, p. 91-126.

Abstracts of Published in the Translation of the KITE (Jun. 1991~Nov. 1991), KITE Journal of Electronics Engineering, 1991, p. 77-95.

Alam M., "Reliability- and Process-Variation Aware Design of Integrated Circuits", 19th European Symposium on Reliability of Electron Devices, Failure Physics and Analysis (ESREF 2008), Microelectronics Reliability, vol. 48, Issues 8-9, Aug.-Sep. 2008, pp. 1114-1122.

Ali Hajimiri, et al., "Jitter and Phase Noise in Ring Oscillators", IEEE Journal of Solid-State Circuits, pp. 790-804, Vol. 34, No. 6, June 1999.

Alon E et al., "Replica Compensated Linear Regulators for Supply Regulated Phase Locked Loops," IEEE J. Solid State Circuits, vol. 41, pp. 413-424, Feb. 2006.

Alvarez A.R., "BiCMOS Technology and Applications", Second Edition, Kluwer Academic Publishers, 1993, pp. 395.

Amara A et al., "Chapter 11. VHDL for Low Power", Low-Power CMOS Circuits-Technology, Logic Design and CAD Tools by Christian Piguet, CRC Press 2005, pp. 1-21.

Anis M et al., "Multi-Threshold CMOS Digital Circuits: Managing Leakage Power", 2003, pp. 219.

Ayhan Pinar., "Probabilistic CMOS (PCMOS) in the Nanoelectronics Regime", Electrical and Computer Engineering, Georgia Institute of Technology, http://hdl.handle.net/1853/19877, 2007, p. 1-174.

Bernhardt B et al., "Complementary GaAs(CGaAs): A High Performance BiCMOS Alternative", Gallium Arsenide Integrated Circuit (GaAs IC) Symposium, 1995. Technical Digest 1995, 17th Annual IEEE, 1995, p. 18-21.

Berridge, R. et al., "IBM Power6 Microprocessor Physical Design and Design Methodology", IBM Journal of Research and Development, Nov. 2007, vol. 51, Issue 6, p. 685-714.

Bhavsar D.K. et al., "Alpha 21164 Testability Strategy", Design & Test of Computers, IEEE, Jan.-Mar. 1997, vol. 14, Issue 1, p. 25-33.

Bhunia S et al., "Power Dissipation, Variations and Nanoscale CMOS Design: Test Challenges and Self-Calibration/Self-Repair Solutions", Test Conference, 2007. ITC 2007. IEEE International, 2007, p. 1-10.

Bipul C. Paul et al., "Low-Power Design Techniques for Scaled Technologies", College of Electrical and Computer Engineering, Purdue University, Integration, the VLSI Journal, vol. 39, Issue 2, Mar. 2006, pp. 64-89.

Brown RB et al., "Complementary GaAs Technology for High-Speed VLSI Circuits", Electrical Engineering and Computer Science Dept., University of Michigan, pp. 8.

Brucek Khailany., "The VLSI Implementation and Evaluation of Area-and Energy-Streaming Media Processors", A dissertation submitted to the department of electrical engineering and the committee on graduate studies of stanford university in partial fulfillment of the requirements for the degree of doctor of philosophy, Jun. 2003, p. 1-166.

Calhoun, B. H, et al., "Design Considerations for Ultra-Low Energy Wireless Microsensor Nodes" IEEE Transactions on Computers, vol. 54, No. 6, Jun. 1, 2005, IEEE Service Center, Los Alamitos, CA, US, DOI: 10.1109/TC.2005.98, pp. 727-740.

Calhoun BH et al., "Low Energy Digital Circuit Design", Amlware Hardware Technology Drivers of Ambient Intelligence, Philips Research Book Series, 2006, vol. 5(4), 181-202.

Chandra V et al., "A Power Aware System Level Interconnect Design Methodology for Latency-Insensitive Systems", ICCAD 2004. International Conference on Computer Aided Design (IEEE Cat. No. 04CH37606), Nov. 7-11, 2004, p. 275-282.

Chang CTM et al., "GaAs HBT's for High-Speed Digital Integrated Circuit Applications", Proceedings of the IEEE, vol. 81, Issue 12, Journals & Magazines, Dec. 1993, p. 1727-1743.

Chattopadhyay A et al., "GALDS: A Complete Framework for Designing Multiclock ASICs and SoCs", Very Large Scale Integration (VLSI) Systems, IEEE Transactions on, vol. 13, Issue 6, p. 641-654.

Cheng, D.K.W et al.," Modeling and Simulation of High Frequency Effects of a Separately Excited DC Motor", China 1991 International Conference on Circuits and Systems. Conference Proceedings (Cat. No. 91TH0387-1), Jun. 16-17, 1991, vol. 1, p. 192-196.

Chinnery D et al., "Overview of the Factors Affecting the Power Consumption", Closing the Power Gap Between ASIC & Custom, 2007, p. 11-53.

Chinnery DG, "Low Power Design Automation", Electrical Engineering and Computer Sciences, University of California at Berkeley, http://www.eecs.berkeley.edu/Pubs/TechRpts/2006/EECS-2006-182.html, Dec. 18, 2006, p. 1-515.

Chiueh H et al., "A Programmable Thermal Management Interface Circuit for PowerPC Systems", Microelectronics Journal, 2001-Elsevier, vol. 32, Issues 10-11, Oct.- Nov. 2001, pp. 875-881.

Cho Youngjin et al., "Memory-Aware Energy-Optimal Frequency Assignment for Dynamic Supply Voltage Scaling", In Proceedings of the IEEE International Symposium on Low Power Electronics and Design (ISLPED), 2004, p. 387-392.

Crow EC et al., Conference 6736: Unmanned/Unattended Sensors and Sensor Networks IV, SPIE Europe, Security + Defence, Sep. 18-20, 2007, Part of Proceedings of SPIE vol. 6736 Unmanned/Unattended Sensors and Sensor Networks IV, p. 1-175.

Davis W.R. et al., "A Design Environment for High-Throughput Low-Power Dedicated Signal Processing Systems", IEEE Journal of Solid-State Circuits, vol. 37, Issue 3, Mar. 2002, p. 420-431.

Dennis Sylvester et al., "Variability in Nanometer CMOS: Impact, Analysis, and Minimization",Integration, the VLSI Journal, vol. 41, Issue 3, May 2008, pp. 319-339.

Dikhtyar, V.B. et al., "Analysis of the Conditions for Harmonic Signal Generation in Microwave Amplifiers with a Delay Line in the Feedback Circuit", Radiotekhnika i Elektronika, Oct. 1975, vol. 20, No. 10, p. 2101-2112.

Duarte D.E. et al., "A Clock Power Model to Evaluate Impact of Architectural and Technology Optimizations", Very Large Scale Integration (VLSI) Systems, IEEE Transactions on, vol. 10, Issue 6, 2002, p. 844-855.

Fitrio D, "Power Management Schemes for Ultra Low Power Biomedical Devices", PhD thesis thesis, Victoria University, 2007.

Goertzel G. et al., "Digital halftoning on the IBM 4250 Printer", IBM Journal of Research and Development, Office Automation Technologies , vol. 31, No. 1, p. 2-15 (1987).

Gray CT et al., "Wave Pipelining: Theory and CMOS Implementation", Springer, 1994-206 pages.

Hempstead M et al., "Architecture and Circuit Techniques for Low-Throughput, Energy-Constrained Systems Across Technology Generations", Proceeding Cases '06 Proceedings of the 2006 international conference on Compilers, architecture and synthesis for embedded systems, 2006, pp. 368-378.

Hwang, et al., "A Digitally Controlled Phase-Locked Loop with a Digital Phase-Frequency Detector for Fast Acquisition," IEEE Journal of Solid-State Circuits, vol. 36, No. 10, Oct. 2001, pp. 1574-1581.

I: Regular Papers, 2007 Index IEEE Transactions on Circuits and Systems, vol. 54, Issue 12, Dec. 2007, p. 2749-2784.

IEEE Journal of Solid-State Circuits, 2007 Index, vol. 42, Issue 12, Dec. 2007, p. 2990-3036.

Isapure MA et al., "Galds: A Complete Framework for Designing Multiclock ASICs and SoCs", KKS DCO, 74 pages.

Johny Pihl,"Design Automation of High Speed Digital Signal Processing in VLSI with Applications in Speech Recognition Systems Based on Hidden Markov Models", Submitted in Partial Fulfillment of the Requirements for the Degree of Doktor Ingenior, Oct. 1996, p. 1-202.

Keitel-Schulz, D. et al., "Embedded DRAM Development: Technology, Physical Design, and Application Issues", Design & Test of Computers, IEEE, vol. 18, Issue 3, May 2001, pp. 7-15.

Kem AM, "PLL-Based Active Optical Clock Distribution", Massachusetts Institute of Technology, 2004, p. 1-105.

Lee R.L., "The Effectiveness of Caches and Data Prefetch Buffers in Large-Scale Shared Memory Multiprocessors", vol. 4901B of Dissertations Abstracts International, 1987, 147 pages.

Lucas, M. et al., "High Power Keeps Cool", Circuits and Devices Magazine, IEEE, Jul.-Aug. 2004, vol. 20, Issue 4, p. 22-30.

Mallik A et al.,"A Case for Clumsy Packet Processors", Proceedings. 37th International Symposium on Microarchitecture, Proceedings. 37th International Symposium on Microarchitecture, 2004, p. 147-156.

Mario Roberto Casu, "High Performance Digital CMOS Circuits in PD-SOI Technology: Modeling and Design", Politecnico di Torino Corso di Dottorato di Ricerca in Ingegneria Elettronica e delle Comunicazioni, p. 1-176.

Mayer G. et al., "Design Methods for Attaining IBM System Z9 Processor Cycle-Time Goals", IBM Journal of Research and Development, IBM System z9, vol. 51, No. 1/2, p. 19 (2007).

McDonald JF,"F-RISC—A 1.0 GOPS Fast Reduced Instruction Set Computer for Super Workstations and TeraOPS Parallel Processing Applications", Rensselaer Polytechnic Inst Troy Ny Center for Integrated Electronics, 1995.

McKinney DL et al., "Digital's DECchip 21066: The First Cost-focused Alpha AXP Chip",Digital Technical Journal, 1994, 22 pages.

Mehrdad Nourani et al., "Chapter 8: Coping with Physical Failures, Soft Errors, and Reliability Issues", From System-on-Chip Test Architectures: Nanometer Design for Testability, University of Texas at Dallas, Richardson, Texas, Nov. 20, 2007.

Muralimanohar Naveen et al., "Interconnect Design Considerations for Large NUCA Caches", ACM SIGARCH Computer Architecture News, vol. 35 Issue 2, May 2007, pp. 369-380.

Nikolic, B., "Design in the Power-Limited Scaling Regime", IEEE Transactions on Electron Devices, vol. 55, Issue 1, Jan. 2008, p. 71-83.

Oliver J et al., "Synchroscalar: Initial Lessons in Power-Aware Design of a Tile-Based Embedded Architecture", Power-Aware Computer Systems, Lecture Notes in Computer Science, 2005, vol. 3164/2005, p. 1-7.

Pinar Korkmaz, "Probabilistic CMOS (PCMOS) in the Nanoelectronics Regime", Georgia Institute of Technology, 2007, 189 pages.

Proceedings of the 44th IEEE 2001 Midwest Symposium on Circuits and Systems. MWSCAS 2001 (Cat. No. 01CH37257), vol. 2, 2001.

Proceedings of the 44th IEEE 2001 Midwest Symposium on Circuits and Systems MWSCAS 2001, IEEE Dayton Chapter, vol. 1 of 2, 2001, p. 0__1-xv.

Richard B. Brown, "Design Optimization of a GaAs RISC Microprocessor with Area-InterconnectMCM Packaging", Michigan Univ Ann Arbor, 1999.

Robert Payne., "Self-Timed Field Programmable Gate Array Architectures", Doctor of Philosophy University of Edinburgh, 1997, p. 1-268.

Schutte Klamer et al., "Optimal Cache Usage for Separable Image Processing Algorithms on General Purpose Workstations", Signal Processing, vol. 59, No. 1, May 1997, pp. 113-122.

Sean Stetson., "Low Jitter Clock Distribution Networks", Dissertation Proposal, The University of Michigan, 1997, 24 pages.

Shearer F, "Power Management in Mobile Devices", Communications Engineering Series, 1st Edition, Release date Dec. 7, 2007, 336 pages.

Singhal Rohit et al., "Data Integrity for on-Chip Interconnects", vol. 6806B of Dissertations Abstracts International, Engineering, Electronics and Electrical, Computer Science, 2007, 122 pages.

Singhal, R. et al., "Information Theoretic Approach to Address Delay and Reliability in Long On-Chip Interconnects", IEEE/ACM International Conference on Computer-Aided Design, 2006. ICCAD '06, Nov. 5-9, 2006, p. 310-314.

Stefan Rusu, "Clock Distribution for High Performance Designs", Interconnect-Centric Design for Advanced SoC and NoC , 2005, pp. 125-152.

Steven Swanson et al., "Area-Performance Trade-offs in Tiled Dataflow Architectures," isca, pp. 314-326, 33rd International Symposium on Computer Architecture (ISCA'06), 2006.

Stolt, B. et al., "Design and Implementation of the POWER6 Microprocessor", Solid-State Circuits, IEEE Journal of, vol. 43, Issue 1, p. 21-28.

Suhwan Kim Et Al: minimizing inductive noise in system on a chip with multiple power gating structure European solid state circuits 2003, Esscirc 03 conference on Sep. 16-18, 2003, piscataway, NJ USA IEEE, 16 septembel""2003, pp. 635-638, XP010677246.

Table of contents—Table des matiéres, A1L-A: Clock Distribution & Interconnects, Circuits and Systems, 2007. NEWCAS 2007, 30 pages.

Table of contents, 50th Midwest Symposium on Circuits and Systems, 2007. MWSCAS 2007, Aug. 5-8, 2007, p. xxiii-Iii.

Table of contents, Canadian Conference on Electrical and Computer Engineering, 2008. CCECE 2008. May 4-7, 2008, p. 000153-000198.

Table of Contents, Circuits and Systems, 2003 IEEE 46th Midwest Symposium on, Dec. 27-30, 2003, vol. 1, p. XXVI-LIV.

Table of Contents, Custom Integrated Circuits Conference, 2004. Proceedings of the IEEE 2004, Oct. 3-6, 2004, p. 0_13-0_20.

Table of Contents, Custom Integrated Circuits Conference, 2007. CICC '07. IEEE, Sep. 16-19, 2007, p. 1-10.

Table of Contents, Design Automation Conference, 2005. Proceedings of the ASP-DAC 2005. Asia and South Pacific, Jan. 18-21, 2005, vol. 2, pp. XXXIV-LVIX.

Table of contents, IEEE International Symposium on Circuits and Systems, 2008. ISCAS 2008, May 18-21, 2008, p. xxxvi-cxxxvi.

Table of contents, Proceedings of the 2004 International Symposium on Circuits and Systems, 2004. ISCAS '04, May 23-26, 2004, vol. 2, p. xvii-XXII.

Table of Contents, Proceedings of the 2004 International Symposium on Circuits and Systems, 2004. ISCAS '04, May 23-26, 2004, vol. 4, p. xvii-XXII.

Table of contents, Proceedings of the 2004 International Symposium on Circuits and Systems, 2004. ISCAS '04, vol. 1, May 23-26, 2004, p. xvii-XXII.

Table of Contents, Proceedings of the 2004 International Symposium on Circuits and Systems, 2004. ISCAS '04, vol. 5, May 23-26, 2004, p. xvii-xi.

Table of Contents, Proceedings of the 2004 International Symposium on Circuits and Systems, 2004. ISCAS '04, vol. 3, May 23-26, 2004, p. xvii-XXII.

Table of Contents, Proceedings of the IEEE Region 10 Conference TENCON 99, vol. 2, Sep. 15-17, 1999, p. xiii-xxxvii.

Talpes, E. et al., "Increased Scalability and Power Efficiency by Using Multiple Speed Pipelines", Proceedings. 32nd International Symposium on Computer Architecture, 2005. ISCA '05, Jun. 4-8, 2005, p. 310-321.

Teodorescu R et al., "Mitigating Parameter Variation with Dynamic Fine-Grain Body Biasing", Microarchitecture, 2007. Micro 2007. 40th Annual IEEE/ACM International Symposium on, Dec. 1-5, 2007, p. 27-42.

Tsoi Kuen-Hung., "A Flexible Arithmetic System for Simulation", A Thesis Submitted in Partial Fulfillment of the Requirements for the Degree of Doctor of Philosophy in Computer Science & Engineering, Nov. 2007, p. 1-120.

Verma, A. et al.,"A K-Band Down-Conversion Mixer with 1.4-GHz Bandwidth in 0.13-µm CMOS Technology", IEEE Microwave and Wireless Components Letters, vol. 15, Issue 8, Aug. 2005, p. 493-495.

Wei Ling, "Low Power and High Speed Arithmetic Circuits for Software Assisted Wireless Systems", Université de Montréal École Polytechnique de Montréal, Département de Génie Électrique École Polytechnique de Montréal, Département de Génie Électrique École Polytechnique de Montréal, 2004, p. 1-139.

Youngjin Cho et al. , "Memory-Aware Energy-Optimal Frequency Assignment for Dynamic Supply Voltage Scaling", Proceedings of the 2004 International Symposium on Low Power Electronics and Design (IEEE Cat. No. 04TH8758), ACM SIGDA; IEEE Circuits and Syst. Soc, Aug. 9-11, 2004, p. 387-392.

Yun Xiang, "On-Chip Thermal Sensor Placement", Master of Science in Electrical and Computer Engineering, Sep. 2008, p. 1-54.

Yung R, "Evaluation of a Commercial Microprocessor", SMLI TR-98-65, Jun. 1998, Sun Microsystems, p. 1-218.

Zheng Hao et al., "Modular Verification of Timed Circuits using Automatic Abstraction", IEEE Transactions on Computer-Aided Design of Integrated Circuits and Systems, vol. 22, Issue 9, Sep. 2003, p. 1138-1153.

Zhiyi Yu, "High Performance and Energy Efficient Multi-core Systems for DSP Applications", Dissertation Submitted in partial satisfaction of the requirements for the degree of Doctor of Philosophy in Electrical and Computer Engineering in the Office of Graduate Studies of the University of California, 2007, p. 1-162.

Zhuravlev, V.I et al., "Optimal Circuit of Frequency Control (AFC)", Izvestiya Vysshikh Uchebnykh Zavedenii, Radioelektronika , vol. 27, No. 11, 1984, p. 74-76.

\* cited by examiner

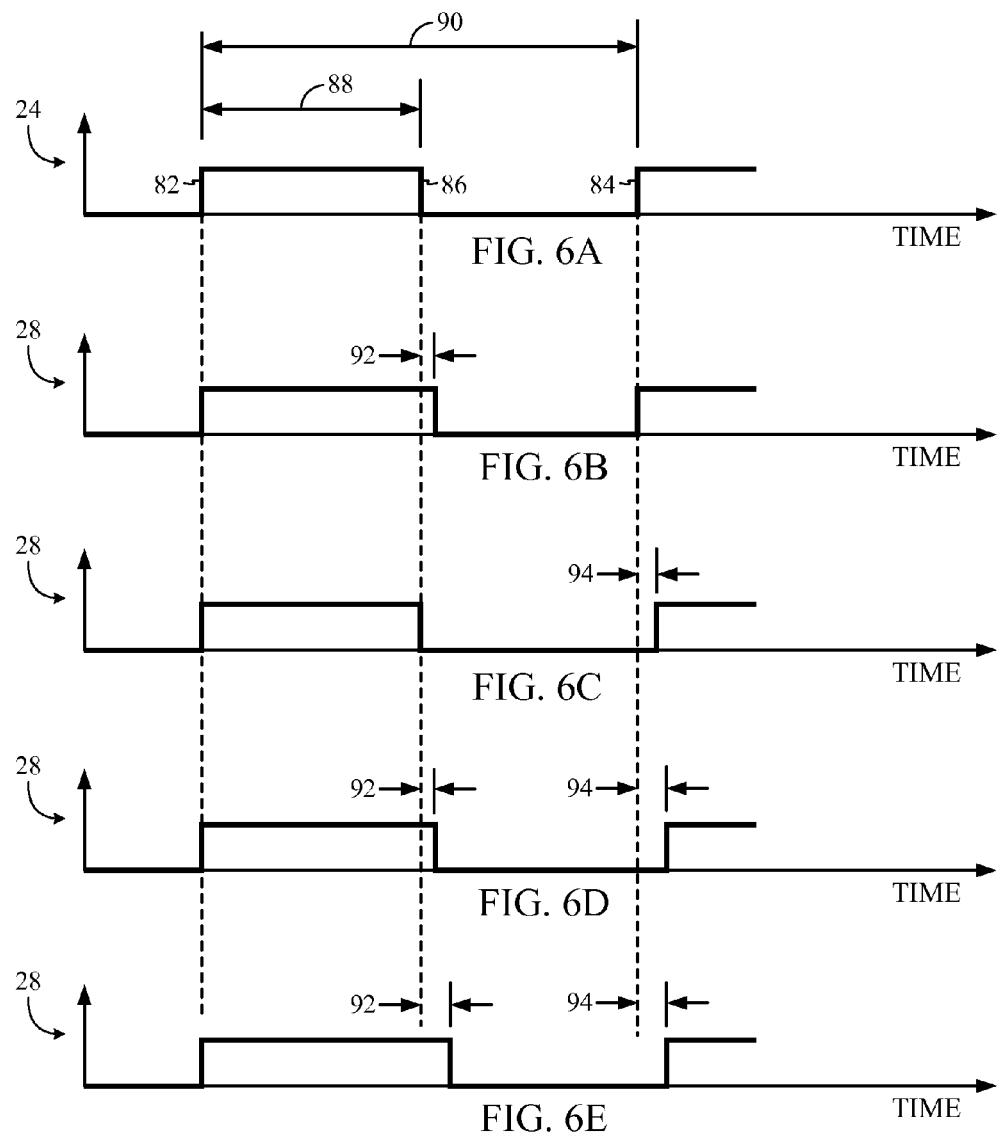

CIRCUITS, SYSTEMS AND METHODS FOR ADJUSTING CLOCK SIGNALS BASED ON MEASURED PERFORMANCE CHARACTERISTICS

BACKGROUND

I. Field of the Disclosure

The technology of the disclosure relates generally to clock adjusting circuits and related circuits, systems, and methods that provide a clock signal to circuits, including but not limited to synchronous digital circuits.

II. Background

Synchronous digital circuits, such as central processing units (CPUs) or digital signal processors (DSPs) as examples, require a clock signal to coordinate timing of logic in the circuit. The frequency of the clock signal controls the switching speed or rate of the logic and thus the performance of the circuit. While it is generally desired to maximize performance by maximizing the frequency of the clock signal, synchronous digital circuits have maximum performance rates beyond which they will not operate properly. Thus, the frequency of the clock signal is controlled to operate within maximum frequency guidelines according to the performance of the components included in the circuit.

Ideally, the frequency of the clock signal would be set to the maximum performance rate of the circuit. However, in operation, the maximum performance rates of synchronous digital circuits and their components can vary and be lowered from ideal rates depending on a variety of conditions, which lead to performance loss. For example, variability in nanometer integrated circuit (IC) processes used to manufacture synchronous digital circuits and their components can cause delay variations. Environmental conditions, such as operating temperature and aging effect of transistors, can also affect performance. Voltage levels supplied by voltage suppliers can be momentarily lowered due to variations in current draw thus momentarily lowering performance as a result. In this regard, frequency generators are configured to control the maximum frequency of the clock signal according to worst case scenarios of the delay variations to provide proper circuit operation over all operating conditions. The delay variations resulting from process variations, temperature variations, and supply voltage variations may collectively be known as process voltage temperature (PVT) delay variations.

The difference between the ideal maximum frequency and the worst case frequency of the clock signal to account for worst case PVT delay variations during operation is known as clock rate margin or frequency margin.

SUMMARY OF THE DISCLOSURE

Embodiments disclosed in the detailed description include circuits, systems, and methods that can be employed to measure a performance characteristic(s) associated with a functional circuit in a semiconductor die and adjust a clock signal, based on the measured performance characteristic(s). The measured performance characteristic(s) may reflect delay variations in the functional circuit and thus may be used to determine safe operating conditions for the functional circuit. Thus, adjusting a clock signal based on the measured performance characteristic(s) may assure proper operation of the functional circuit.

In this regard, in one embodiment, a circuit for adjusting a clock signal is provided. The circuit comprises a performance monitoring circuit provided in a semiconductor die and configured to measure at least one performance characteristic associated with a functional circuit in the semiconductor die. The circuit also includes a clock adjustment circuit configured to adjust a clock signal based on the at least one performance characteristic to provide an adjusted clock signal. The adjusted clock signal can be provided to the functional circuit.

In another embodiment, a method for adjusting a clock signal is provided. The method includes measuring at least one performance characteristic associated with a functional circuit in the semiconductor die using a performance monitoring circuit in the semiconductor die. The method further includes adjusting a clock signal based on the at least one performance characteristic to provide an adjusted clock signal. The method can also include providing the adjusted clock signal to the functional circuit.

In another embodiment, a semiconductor die is provided. The semiconductor die comprises a performance monitoring circuit configured to measure at least one performance characteristic associated with a functional circuit in the semiconductor die. A clock adjustment circuit is configured to adjust a clock signal based on the at least one performance characteristic to provide an adjusted clock signal to the functional circuit.

Exemplary embodiments of the functional circuit may include synchronous digital circuits, which utilize at least one clock signal for timing, synchronization, or the like. Clock signals typically have primary transitions and secondary transitions. Often, synchronous digital circuits respond only to primary transitions. As such, timing between primary transitions may be tightly controlled and timing from primary transitions to secondary transitions may be loosely controlled. However, for maximum performance, certain portions of some synchronous digital circuits may respond to both primary and secondary transitions. In this regard, timing adjustments may affect timing between primary transitions or between primary and secondary transitions of certain synchronous digital circuits.

Exemplary embodiments of the functional circuit may also include computer processing circuitry making accesses to memory, wherein the accesses to memory may be a frequency limiting aspect of the functional circuit. Therefore, the clock adjustment circuit may be used to adjust one or more clocks associated with memory accesses. In an exemplary embodiment of the computer processing circuitry, read accesses of a level 1 (L1) cache are a frequency limiting aspect of the computer processing circuitry. Therefore, the clock adjustment circuit may be used to adjust a clock associated with read accesses of the L1 cache to compensate for PVT delay variations in the computer processing circuitry.

BRIEF DESCRIPTION OF THE FIGURES

FIG. 6A is an exemplary timing diagram of a non-adjusted clock signal associated with the exemplary clock adjustment circuitry illustrated in FIG. 1;

FIGS. 6B-6E are four exemplary timing diagrams of four exemplary embodiments of an adjusted clock signal associated with the exemplary clock adjustment circuitry illustrated in FIG. 1;

DETAILED DESCRIPTION

Figure 1:
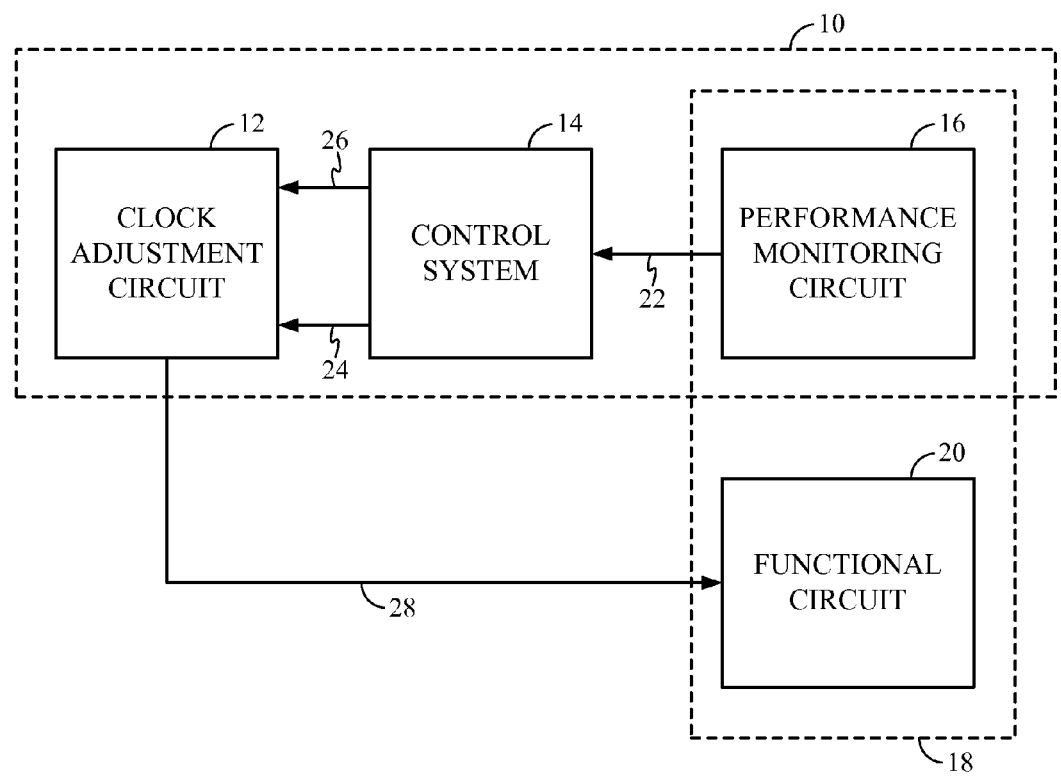
FIG. 1 is a block diagram of exemplary clock adjustment circuitry.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include circuits, systems, and methods that can be employed to measure a performance characteristic(s) associated with a functional circuit in a semiconductor die and adjust a clock signal, based on the measured performance characteristic(s). The measured performance characteristic(s) may reflect delay variations in the functional circuit and thus may be used to determine safe operating conditions for the functional circuit. For example, the delay variations may be process, voltage, and/or temperature (PVT) delay variations. The adjusted clock signal based on the measured performance characteristic(s) can be used to provide a clock signal to a functional circuit provided in the semiconductor die to assure proper operation of the functional circuit while operating with delay variations.

In this regard, a performance monitoring circuit can be provided in the semiconductor die that includes the functional circuit. As a result, the performance monitoring circuit may be exposed to similar delay variation conditions as the functional circuit. Therefore, a performance characteristic(s) measured by the performance measuring circuitry may reflect delay variations in the performance measuring circuitry and may correlate with delay variations in the functional circuit. The performance monitoring circuit is configured to measure a performance characteristic(s) associated with the semiconductor die.

In this regard, in one embodiment, a circuit for adjusting a clock signal is provided. The circuit comprises a performance monitoring circuit provided in a semiconductor die and configured to measure at least one performance characteristic associated with a functional circuit in the semiconductor die. The circuit also includes a clock adjustment circuit configured to adjust a clock signal based on the at least one performance characteristic to provide an adjusted clock signal. The adjusted clock signal can be provided to the functional circuit.

The measured performance characteristic(s) may be used to determine safe operating conditions for the functional circuit. In this regard, the performance characteristic(s) is used to adjust a clock signal to provide an adjusted clock signal to the functional circuit for proper operation based on the performance characteristic(s). By using embodiments of the disclosure, as an example, critical path(s) of functional circuits may be provided with adjusted clock signal(s) that reduce or eliminate the frequency limits, thereby enabling use of higher operating frequencies and increasing performance.

Exemplary embodiments of the functional circuit may include synchronous digital circuits, which utilize at least one clock signal for timing, synchronization, or the like. Clock signals typically have primary transitions and secondary transitions. For example, primary transitions may be LOW to HIGH transitions and secondary transitions may be HIGH to LOW transitions or vice versa. Often, synchronous digital circuits respond only to primary transitions. As such, timing between primary transitions may be tightly controlled and timing from primary transitions to secondary transitions may be loosely controlled. However, for maximum performance, portions of some synchronous digital circuits may respond to both primary and secondary transitions. Embodiments of the functional circuit may respond only to primary transitions, to secondary transitions, to primary and secondary transitions, or any combination thereof. Therefore, timing adjustments may affect timing between primary transitions, between secondary transitions, between primary and secondary transitions, or any combination thereof.

Exemplary embodiments of the functional circuit may also include computer processing circuitry making accesses to memory, wherein the accesses to memory may be a frequency limiting aspect of the functional circuit. Therefore, the clock adjustment circuit may be used to adjust one or more clocks associated with memory accesses. In an exemplary embodiment of the computer processing circuitry, read accesses of a level 1 (L1) cache are a frequency limiting aspect of the computer processing circuitry. Therefore, the clock adjustment circuit may be used to adjust a clock associated with read accesses of the L1 cache to compensate for PVT delay variations in the computer processing circuitry. The read accesses of the L1 cache may be associated with circuitry that is responsive only to primary transitions, to primary and secondary transitions, or both. Embodiments of the clock adjustment circuit may include a clock edge adjustment circuit, a clock synthesis circuit, or both to provide adjustments to the clock signal. Embodiments of the performance measuring circuitry may include one or more ring oscillator circuits to measure performance characteristic(s) associated with the semiconductor die.

In this regard, FIG. 1 is a block diagram of clock adjustment circuitry 10, according to one embodiment of the present disclosure. The clock adjustment circuitry 10 includes a clock adjustment circuit 12, a control system 14, and a performance monitoring circuit 16. A semiconductor die 18 may provide the performance monitoring circuit 16 and a functional circuit 20, which may include a critical path(s) that may limit an operating frequency of the functional circuit 20. The performance monitoring circuit 16 may be indicative of performance characteristics of the functional circuit 20 in order to identify clock adjustments that may enable the functional circuit 20 to function properly. In this embodiment, the functional circuit 20 and the performance monitoring circuit 16 are provided on the same semiconductor die 18 in order to realize correlation of PVT delay variations between the performance monitoring circuit 16 and the functional circuit 20, although embodiments where the performance monitoring circuit 16 and the functional circuit 20 are not on the same die are possible.

In one embodiment of the semiconductor die 18, the performance monitoring circuit 16 measures at least one performance characteristic associated with at least a portion of the semiconductor die 18. The performance monitoring circuit 16 may be exposed to similar PVT conditions as the critical path(s) of the functional circuit 20. Therefore, the performance characteristic(s) measured by the performance monitoring circuit 16 may reflect PVT delay variations in the performance monitoring circuit 16 and may correlate with PVT delay variations in the critical path(s) of the functional circuit 20. Thus, the measured performance characteristics may be used to determine safe operating conditions for the critical path(s) of the functional circuit 20.

In this regard, the performance monitoring circuit 16 provides performance information 22 to the control system 14 based on the measured performance characteristic(s) associated with the semiconductor die 18. The control system 14 uses the performance information 22 to determine at least one proper clock adjustment, which enables the critical path(s) of the functional circuit 20 to operate properly. The control system 14 provides a first clock signal 24 and clock adjustment information 26 based on the proper clock adjustment(s) to the clock adjustment circuit 12. The clock adjustment circuit 12 may adjust the first clock signal 24 to provide a second clock signal 28, which may be an adjusted clock signal, to the functional circuit 20 based on the clock adjustment information 26. Thus, the second clock signal 28 referred to herein may also be referred to herein as an adjusted clock signal. The second clock signal 28 may function as a clock input signal to the critical path(s) of the functional circuit 20, to other circuitry in the functional circuit 20, or both. In other embodiments of the functional circuit 20, the functional circuit 20 may operate using the second clock signal 28 and one or more additional clock signals (not shown). Alternate embodiments of the clock adjustment circuitry 10 may omit the control system 14, wherein the performance monitoring circuit 16 provides the performance information 22 directly to the clock adjustment circuit 12, which provides the second clock signal 28 based on the performance information 22.

Figure 2:
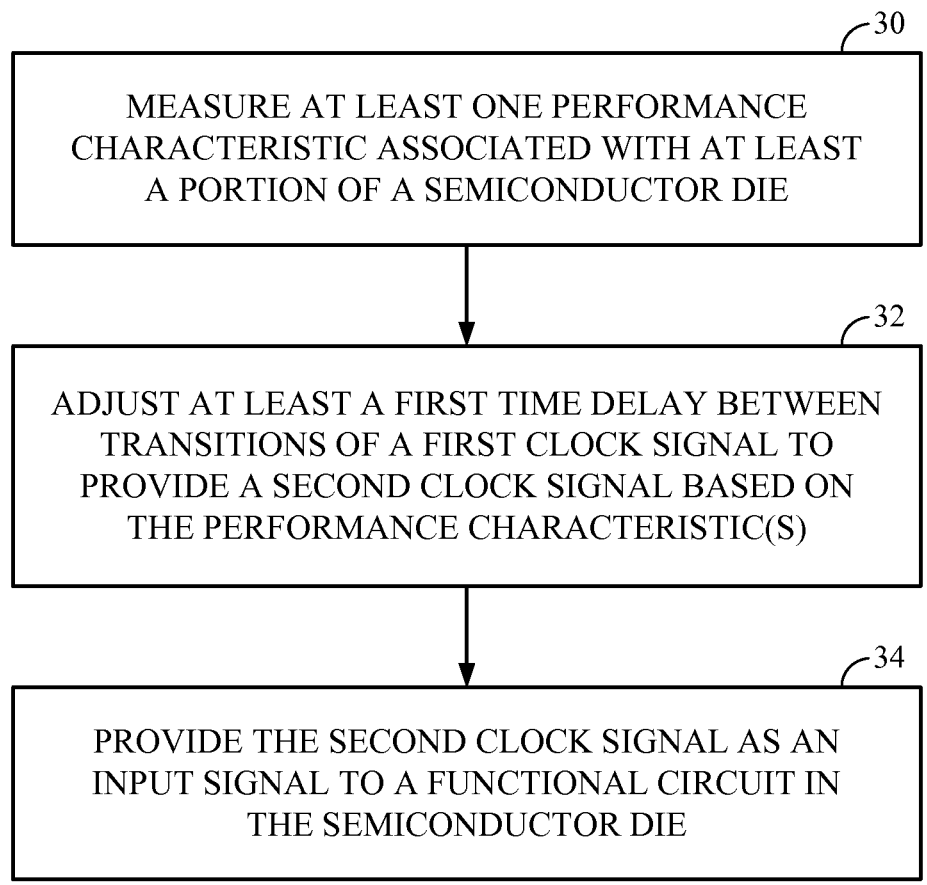
FIG. 2 is an exemplary flowchart of a process for adjusting a clock signal using the exemplary clock adjustment circuitry illustrated in FIG. 1.

FIG. 2 is an exemplary flowchart of a process for adjusting a clock signal associated with the clock adjustment circuitry 10 illustrated in FIG. 1. In an exemplary embodiment of the clock adjustment circuitry 10, the performance monitoring circuit 16 measures at least one performance characteristic associated with at least a portion of the semiconductor die 18 (block 30). Next, the clock adjustment circuit 12 adjusts at least a first time delay between transitions of the first clock signal 24 to provide the second clock signal 28 based on the performance characteristic(s) (block 32). As will be discussed in more detail below, this adjustment to provide the second clock signal 28 may be a manipulation of clock edges of the first clock signal 24, or may include regeneration of the first clock signal 24 with adjustments to provide the second clock signal 28. The clock adjustment circuit 12 provides the second clock signal 28 to the functional circuit 20, which is in the semiconductor die 18 (block 34). The performance monitoring circuit 16 may measure the performance characteristic(s) as needed. For example, the performance monitoring circuit 16 may measure the performance characteristic(s) on a periodic basis, on demand, upon initialization of the clock adjustment circuitry 10, upon initialization of the functional circuit 20, upon power-up of the clock adjustment circuitry 10, upon power-up of the functional circuit 20, upon reset of the clock adjustment circuitry 10, upon reset of the functional circuit 20, the like, or any combination thereof. One embodiment of the performance monitoring circuit 16 includes digital circuitry, which measures at least one performance characteristic of the digital circuitry. The measured performance characteristic(s) may correlate with performance characteristics of the functional circuit 20. In some systems, the semiconductor die 18 may provide the entire system, including the clock adjustment circuit 12, the control system 14, the performance monitoring circuit 16, and the functional circuit 20.

Figure 3A:
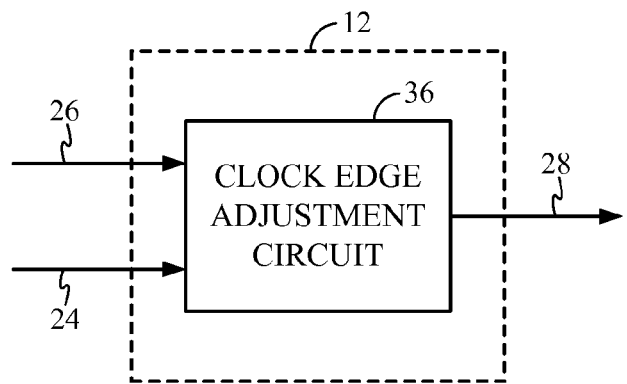
FIG. 3A is a block diagram of an exemplary clock adjustment circuit associated with the exemplary clock adjustment circuitry illustrated in FIG. 1.
Figure 3B:
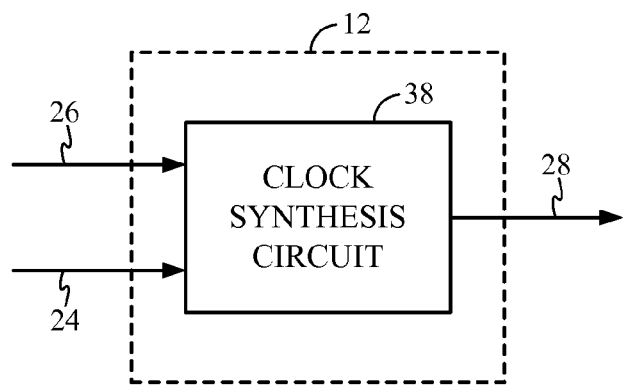
FIG. 3B is a block diagram of an alternate exemplary clock adjustment circuit associated with the exemplary clock adjustment circuitry illustrated in FIG. 1.
Figure 3C:
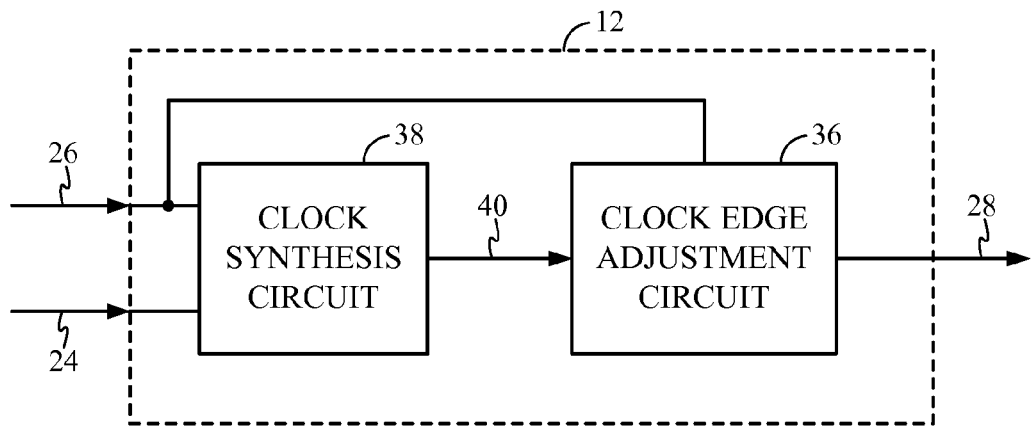
FIG. 3C is a block diagram of an additional exemplary clock adjustment circuit associated with the exemplary clock adjustment circuitry illustrated in FIG. 1.

FIG. 3A is a block diagram of an exemplary embodiment of the clock adjustment circuit 12, FIG. 3B is a block diagram of an alternate exemplary embodiment of the clock adjustment circuit 12, and FIG. 3C is a block diagram of an additional exemplary embodiment of the clock adjustment circuit 12.

The clock adjustment circuit 12 that adjusts the second clock signal 28 based on the performance characteristic(s) measured by the performance monitoring circuit 16 in FIG. 1 may be implemented in various manners. For example, FIG. 3A is a block diagram of the clock adjustment circuit 12 in FIG. 1 according to one embodiment. In this example, the clock adjustment circuit 12 includes a clock edge adjustment circuit 36. The control system 14 (FIG. 1) provides the first clock signal 24 and the clock adjustment information 26 based on the proper clock adjustment(s) to the clock edge adjustment circuit 36, which may be used to adjust either a primary transition or a secondary transition of the first clock signal 24 to provide the second clock signal 28.

FIG. 3B is a block diagram of another example of the clock adjustment circuit 12 according to another embodiment in FIG. 1. In this example, the clock adjustment circuit 12 includes a clock synthesis circuit 38. The control system 14 (FIG. 1) provides the first clock signal 24 and the clock adjustment information 26 based on the proper clock adjustment(s) to the clock synthesis circuit 38, which may be used to adjust both a primary transition and a secondary transition of the first clock signal 24 to provide the second clock signal 28. The intent of the clock synthesis circuit 38 is to change the period of the first clock signal 24 to provide the second clock signal 28. Thus, in this example, the first clock signal 24 may be used as a reference clock to synthesize the second clock signal 28, as opposed to delaying one or both edges of the first clock signal 24 to produce the second clock signal 28, as shown in the example of the clock edge adjustment circuit 36 of FIG. 3A. Synthesizing the second clock signal 28 may include regenerating the first clock signal 24 with period adjustments.

FIG. 3C is a block diagram of another example of the clock adjustment circuit 12 according to another embodiment of in FIG. 1. In this example, the clock adjustment circuit 12 includes the clock synthesis circuit 38 and the clock edge adjustment circuit 36. The control system 14 (FIG. 1) provides the first clock signal 24 to the clock synthesis circuit 38 and the clock adjustment information 26 based on the proper clock adjustment(s) to both the clock synthesis circuit 38 and the clock edge adjustment circuit 36, both of which may be used to adjust a primary transition, a secondary transition, or both, of the first clock signal 24 to provide the second clock signal 28. The clock synthesis circuit 38 provides a third clock signal 40 to the clock edge adjustment circuit 36. The clock synthesis circuit 38 may change the period of the first clock signal 24 to provide the third clock signal 40. By changing the period of the first clock signal 24, both primary transitions and secondary transitions may change. The clock edge adjustment circuit 36 may be used to adjust either the primary transitions or the secondary transitions as changed in the third clock signal 40 to provide the second clock signal 28.

For example, the clock synthesis circuit 38 may be used to change the period of the first clock signal 24 to obtain a desired adjustment of the primary transitions. However, an undesired side effect is that the secondary transitions also change. The clock edge adjustment circuit 36 may be used to adjust the secondary transition as changed in the third clock signal 40 to a desired adjustment to provide the second clock signal 28.

Figure 4:
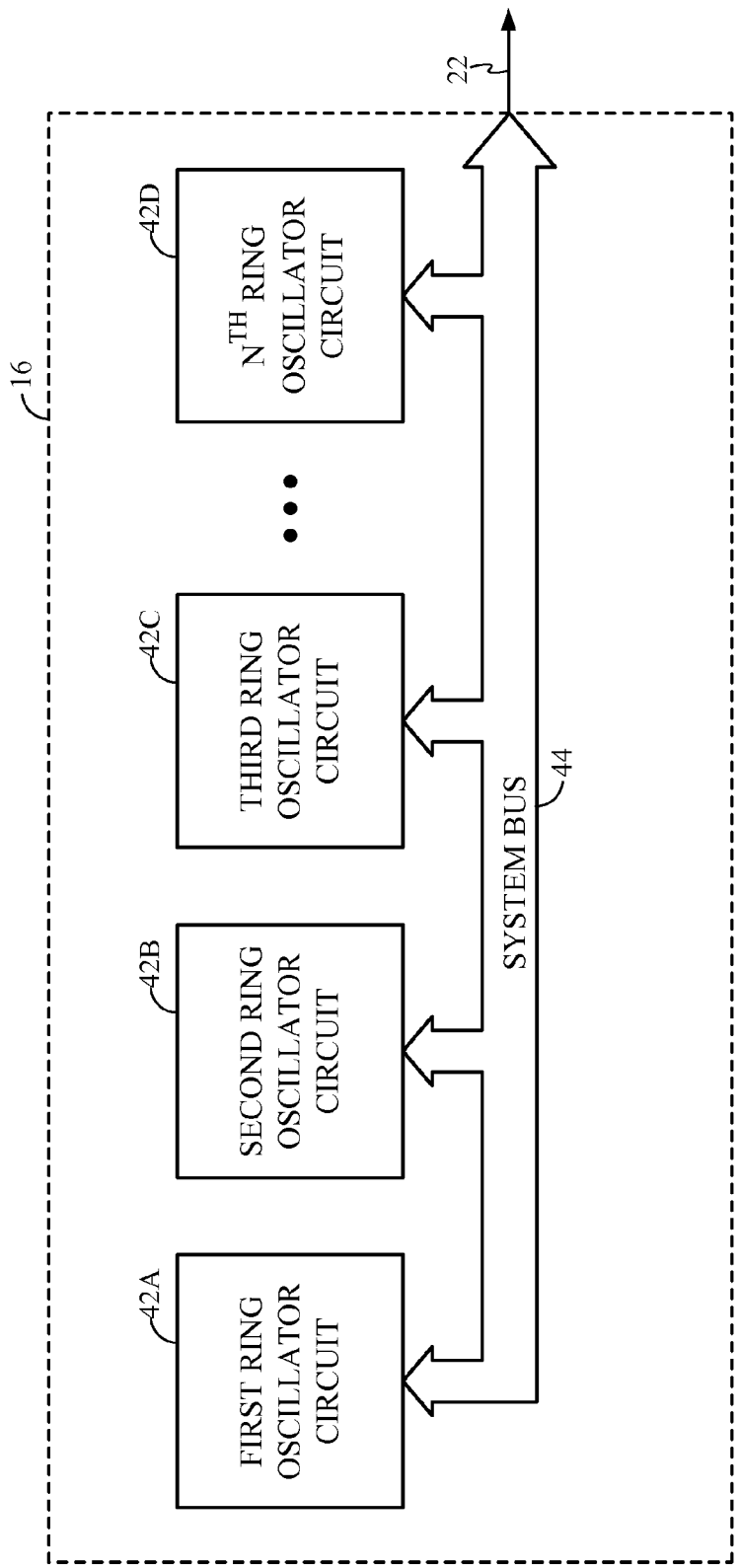
FIG. 4 is a block diagram of an exemplary performance monitoring circuit associated with the exemplary semiconductor die illustrated in FIG. 1.

As previously mentioned, the performance monitoring circuit 16 may be implemented using a variety of circuits or methods. FIG. 4 illustrates an example of one such circuit. For example, the performance monitoring circuit 16 may include at least one ring oscillator circuit to measure performance of at least a portion of the semiconductor die 18, according to one embodiment of the performance monitoring circuit 16. In this example, the performance monitoring circuit 16 includes a first ring oscillator circuit 42A, a second ring oscillator circuit 42B, a third ring oscillator circuit 42C, and up to and including an $N^{TH}$ ring oscillator circuit 42D. Any or all of the ring oscillator circuits 42A, 42B, 42C, 42D may be used to measure performance characteristics associated with at least a portion of the semiconductor die 18 (FIG. 1). The performance characteristics measured by the ring oscillator circuits 42A, 42B, 42C, 42D may be indicative of PVT delay variations in the ring oscillator circuits 42A, 42B, 42C, 42D. The PVT delay variations in the ring oscillator circuits 42A, 42B, 42C, 42D may correlate with PVT delay variations in the functional circuit 20 (FIG. 1). In an exemplary embodiment of the performance monitoring circuit 16, each of the ring oscillator circuits 42A, 42B, 42C, 42D may include different types of transistors. For example, the first ring oscillator circuit 42A may include low threshold voltage (LVT) field effect transistors (FETs), the second ring oscillator circuit 42B may include high threshold voltage (HVT) FETs, and the third ring oscillator circuit 42C may include nominal threshold voltage (NVT) FETs. LVT FETs may increase performance (i.e., speed) of a circuit. However, LVT FETs have higher current leakage profiles as compared to NVT and HVT FETs, which leads to increased power consumption. PVT delay variations in the first ring oscillator circuit 42A may correlate with PVT delay variations in circuits containing LVT FETs in the functional circuit 20. Similarly, PVT delay variations in the second ring oscillator circuit 42B may correlate with PVT delay variations in circuits containing HVT FETs in the functional circuit 20, and PVT delay variations in the third ring oscillator circuit 42C may correlate with PVT delay variations in circuits containing NVT FETs in the functional circuit 20. The ring oscillator circuits 42A, 42B, 42C, 42D may be coupled to a system bus 44 to provide the performance information 22.

Figure 5:
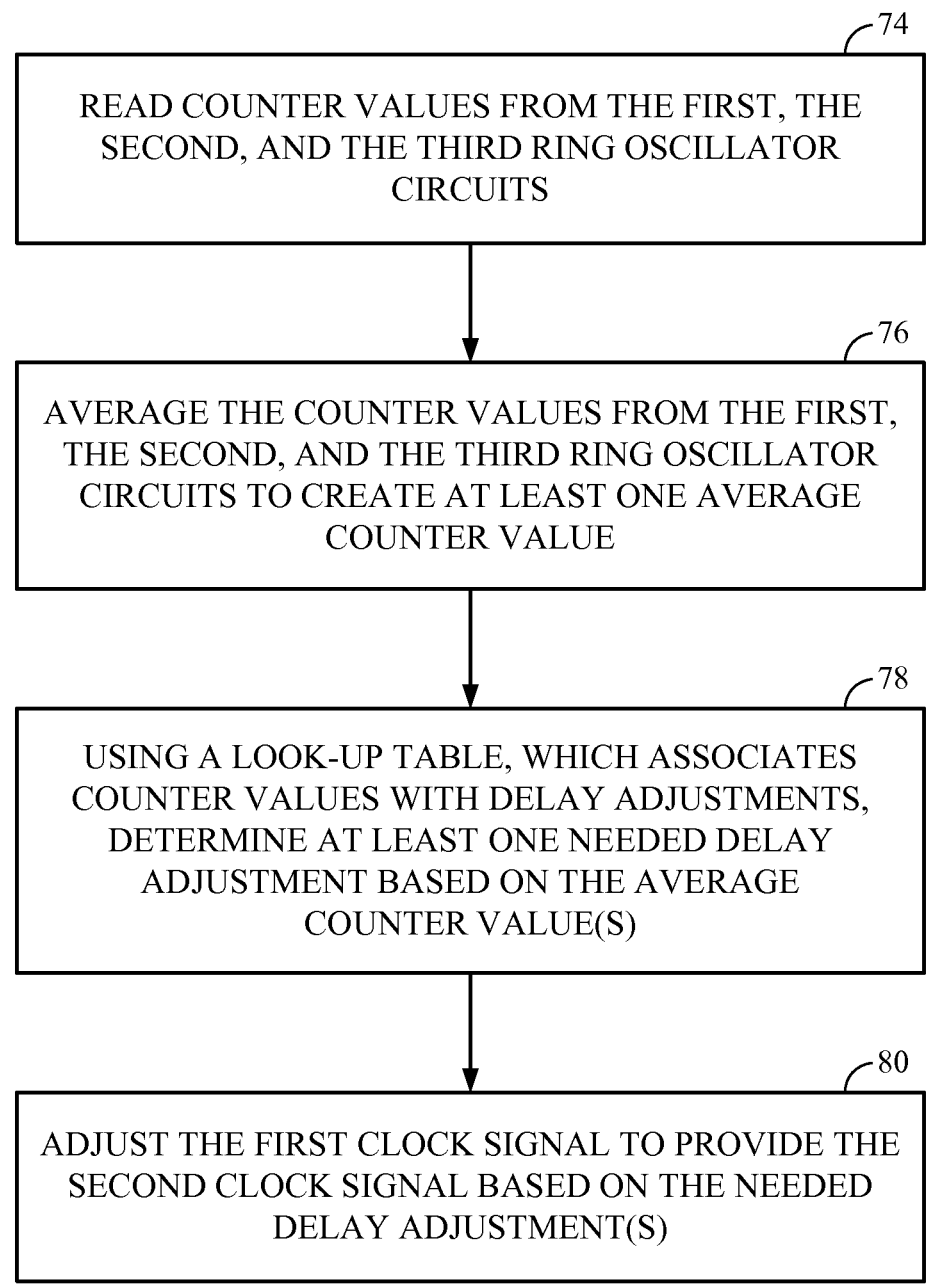
FIG. 5 is an exemplary flowchart of a process for adjusting a clock signal associated with the exemplary semiconductor die illustrated in FIG. 1.

As previously mentioned, the ring oscillator circuits 42A, 42B, 42C, 42D illustrated in FIG. 4 can be used to obtain performance information 22 associated with the semiconductor die 18. Delay characteristics of the functional circuit 20 may vary at different locations of the semiconductor die 18. As such, the ring oscillator circuits 42A, 42B, 42C, 42D may be located in different areas of the semiconductor die 18 to adequately characterize the delay variations. In an exemplary embodiment of the semiconductor die 18, three of the ring oscillator circuits 42A, 42B, 42C, 42D are used to characterize delay variations at different locations of the semiconductor die 18. Alternate embodiments of the semiconductor die 18 may use any number of the ring oscillator circuits 42A, 42B, 42C, 42D for delay characterization of the semiconductor die 18. Data from each of the ring oscillator circuits 42A, 42B, 42C, 42D may be combined and averaged to determine the performance information 22. To illustrate operation of the ring oscillator circuits 42A, 42B, 42C, 42D, FIG. 5 shows a process for using the first, the second, and the third ring oscillator circuits 42A, 42B, 42C. As such, FIG. 5 is an exemplary flowchart of a process for adjusting a clock signal associated with the exemplary embodiment of the semiconductor die 18 illustrated in FIG. 1. In this example, the process begins by reading counter values from the first, the second, and the third ring oscillator circuits 42A, 42B, 42C (block 74). The process continues by averaging the counter values from the first, the second, and the third ring oscillator circuits 42A, 42B, 42C to create at least one average counter value (block 76). The process further continues by using a look-up table, which associates counter values with delay adjustments, and determining at least one needed delay adjustment based on the average counter value(s) (block 78). The process completes by adjusting the first clock signal 24 (FIG. 1) to provide the second clock signal 28 (FIG. 1) based on the needed delay adjustment(s) (block 80). The flowchart illustrated in FIG. 5 is an exemplary embodiment of the present disclosure and not intended to limit the scope of the present disclosure.

Note that readings from three ring oscillators 42A, 42B, 42C are used in the example of FIG. 4, but note that only one reading from one ring oscillator 42 or readings for any plurality, combination of, or all of the available ring oscillators 42 provided in the semiconductor die 18 may be employed to provide a delay adjustment(s). For example, if readings from more than one ring oscillator 42 are employed, the readings may be averaged together to provide an average counter value to select an appropriate delay adjustment(s). The average could be weighted if ring oscillators 42 in one or more areas of the semiconductor die 18 are determined to be more influential to the performance of the functional circuit 20 than others or portions of the functional circuit 20, including a critical path(s) of the functional circuit 20, are located more closely to certain ring oscillators 42 than others provided in the semiconductor die 18. Alternatively, the counter value read having the smallest value among a plurality of counter values from a plurality of ring oscillators 42 may be used to determine delay adjustment(s). In this manner, the delay adjustment is provided to account for the worst case performance characteristics of the semiconductor die 18 as determined by placement of the ring oscillators 42 in the semiconductor die 18. The read counter value(s) may be from one or more of the ring oscillators 42 and may be processed or analyzed in any manner desired, without limitation.

FIGS. 6A-6E are timing diagrams associated with the clock adjustment circuit 12 illustrated in FIG. 1 to further illustrate and explain various embodiments on how the second clock signal 28 can be provided employing the performance monitoring circuit 16. FIG. 6A is a timing diagram of the first clock signal 24, which is a non-adjusted clock signal. The second clock signal 28 is an adjusted clock signal. As such, FIGS. 6B-6E are four timing diagrams illustrating four different embodiments of the second clock signal 28 associated with timing adjustments between primary transitions and between primary and secondary transitions. Each of the four different embodiments is used to address specific needs of the functional circuit 20. For example, FIG. 6B shows the second clock signal 28 after an adjustment to a secondary transition. FIG. 6C shows the second clock signal 28 after an adjustment to a primary transition. FIG. 6D shows the second clock signal 28 after an adjustment to the frequency of the second clock signal 28. FIG. 6E shows the second clock signal 28 after adjustments to both primary and secondary transitions.

As referenced above, FIG. 6A is a timing diagram of the first clock signal 24 according to one embodiment of the first clock signal 24, which is a non-adjusted clock signal. The first clock signal 24 has a first primary transition 82, a second primary transition 84, a first secondary transition 86, a first time delay 88 between the first primary transition 82 and the first secondary transition 86, and a second time delay 90 between the first primary transition 82 and the second primary transition 84. The first secondary transition 86 is the first transition following the first primary transition 82 and the second primary transition 84 is the first transition following the first secondary transition 86. Therefore, the first primary transition 82 and the first secondary transition 86 are adjacent transitions, the first secondary transition 86 and the second primary transition 84 are adjacent transitions, and the first primary transition 82 and the second primary transition 84 are adjacent primary transitions. The second time delay 90 is a period of the first clock signal 24.

In one embodiment of the first clock signal 24, the second time delay 90 is tightly controlled and the first time delay 88 is loosely controlled. For circuits that are only responsive to primary transitions, variations in the first time delay 88 may not be relevant. However, circuits that are responsive to secondary transitions may be sensitive to variations in the first time delay 88. For example, cache memory circuits may utilize both primary and secondary transitions 82, 84, 86 to provide quick access to the cache memory. In one embodiment, the functional circuit 20 includes a cache memory read circuit. Even if the first time delay 88 is tightly controlled, the first time delay 88 may be insufficient in the presence of worst case PVT delay variations.

As referenced above, FIG. 6B shows a first embodiment of the second clock signal 28 after an adjustment to a secondary transition. FIG. 6B is a timing diagram of the second clock signal 28 according to the first embodiment of the second clock signal 28. The first time delay 88 of the first clock signal 24 is adjusted by applying only a secondary transition adjustment 92 to the first clock signal 24 to provide the second clock signal 28. As mentioned previously, the first time delay 88 is between the first primary transition 82 and the adjacent first secondary transition 86 of the first clock signal 24. The secondary transition adjustment 92 to the first clock signal 24 may accommodate timing needs of the functional circuit 20, may compensate for PVT delay variations in the functional circuit 20, may compensate for a loosely controlled first time delay 88, or any combination thereof. The secondary transition adjustment 92 is illustrated in FIG. 6B as a delay of the first secondary transition 86. In an alternate embodiment of the second clock signal 28, the secondary transition adjustment 92 advances (not shown) the first secondary transition 86. In one embodiment of the functional circuit 20, the secondary transition adjustment 92 advances (not shown) the first secondary transition 86 to provide a required delay between the first secondary transition 86 and the second primary transition 84.

As referenced above, FIG. 6C shows a second embodiment of the second clock signal 28 after an adjustment to a primary transition. FIG. 6C is a timing diagram of the second clock signal 28 according to the second embodiment of the second clock signal 28. The second time delay 90 of the first clock signal 24 is adjusted by applying a primary transition adjustment 94 to the first clock signal 24 to provide the second clock signal 28. Since the second time delay 90 is between the first primary transition 82 and the second primary transition 84, the second time delay 90 is between adjacent primary transitions of the first clock signal 24. The primary transition adjustment 94 to the first clock signal 24 may accommodate timing needs of the functional circuit 20, may compensate for PVT delay variations in the functional circuit 20, or both. The primary transition adjustment 94 is illustrated in FIG. 6C as a delay of the second primary transition 84. In an alternate embodiment of the second clock signal 28, the primary transition adjustment 94 advances (not shown) the second primary transition 84.

As referenced above, FIG. 6D shows a third embodiment of the second clock signal 28 after an adjustment of the frequency of the second clock signal 28. As is well known in the art, the frequency of a signal is equal to an inverse of the period of a signal. FIG. 6D is a timing diagram of the second clock signal 28 according to the third embodiment of the second clock signal 28, wherein the period of the first clock signal 24 is adjusted to provide the second clock signal 28. Therefore, both the first time delay 88 and the second time delay 90 of the first clock signal 24 are adjusted by applying both the secondary transition adjustment 92 and the primary transition adjustment 94 to the first clock signal 24 to provide the second clock signal 28. For example, if a clock synthesis circuit is used to provide the second clock signal 28 using the first clock signal 24 as a reference clock signal, the period, which is equal to the second time delay 90, of the first clock signal 24 may be adjusted. The intent is to control the period of the second clock signal 28. To provide fine resolution of the primary transition adjustment 94, the clock synthesis circuit 38 may include a fractional integer divide circuit for example, which may be based on switching between two integer divide values with a duty-cycle. Varying the duty-cycle varies a fractional portion of the divide value. Fractional integer divide circuits are known in the art. As a result, the second clock signal 28 may be controlled to have subtle differences from the period of the first clock signal 24.

Changes to the first time delay 88 are not necessarily important, but are a natural behavior of the clock synthesis circuit. The primary transition adjustment 94 to the first clock signal 24 may accommodate timing needs of the functional circuit 20, may compensate for PVT delay variations in the functional circuit 20, or both. The primary and secondary transition adjustments 94, 92 are illustrated in FIG. 6D as delays of the first secondary transition 86 and the second primary transition 84. In an alternate embodiment of the second clock signal 28, the secondary transition adjustment 92 advances (not shown) the first secondary transition 86 and the primary transition adjustment 94 advances (not shown) the second primary transition 84.

As referenced above, FIG. 6E shows a fourth embodiment of the second clock signal 28 after adjustments to both a primary transition and a secondary transition. FIG. 6E is a timing diagram of the second clock signal 28 according to the fourth embodiment of the second clock signal 28. The fourth embodiment of the second clock signal 28 is a combination of the first and the second embodiments of the second clock signal 28 illustrated in FIGS. 6B and 6C, respectively. The first time delay 88 is adjusted by applying a secondary transition adjustment 92, and the second time delay 90 is adjusted by applying a primary transition adjustment 94 to the first clock signal 24 to provide the second clock signal 28. Since the second time delay 90 is between the first primary transition 82 and the second primary transition 84, the second time delay 90 is between adjacent primary transitions of the first clock signal 24, and as mentioned previously, the first time delay 88 is between the first primary transition 82 and the adjacent first secondary transition 86 of the first clock signal 24. The secondary transition adjustment 92 to the first clock signal 24 may accommodate timing needs of the functional circuit 20, may compensate for PVT delay variations in the functional circuit 20, may compensate for a loosely controlled first time delay 88, or any combination thereof. The primary transition adjustment 94 to the first clock signal 24 may accommodate timing needs of the functional circuit 20, may compensate for PVT delay variations in the functional circuit 20, or both. The primary and secondary transition adjustments 94, 92 are illustrated in FIG. 6E as delays of the first secondary transition 86 and the second primary transition 84. In alternate embodiments of the second clock signal 28, the secondary transition adjustment 92 advances (not shown) the first secondary transition 86, the primary transition adjustment 94 advances (not shown) the second primary transition 84, or both.

The first clock signal 24 illustrated in FIG. 6A shows the first and the second primary transitions 82, 84 as logic level LOW to logic level HIGH transitions and the secondary transition 86 as a logic level HIGH to a logic level LOW transition. In an alternate embodiment of the first clock signal 24, the primary transitions of the first clock signal 24 are from logic level HIGH to logic level LOW (not shown), and the secondary transitions of the first clock signal 24 are from logic level LOW to logic level HIGH (not shown).

As mentioned previously and illustrated in FIGS. 6A and 6B, the first time delay 88 of the first clock signal 24 is adjusted by applying the secondary transition adjustment 92 to the first clock signal 24 to provide the second clock signal 28. As illustrated in FIG. 6B, the secondary transition adjustment 92 may delay the first secondary transition 86 of the first clock signal 24 to provide the second clock signal 28. As such, the clock edge adjustment circuit 36, which is illustrated in FIG. 3A, may include a programmable delay circuit 110 to delay the first secondary transition 86 of the first clock signal 24, to delay the second primary transition 84 of the first clock signal 24, or both. The programmable delay circuit 110 may be implemented using a variety of circuits or methods. In this regard, FIG. 7A is a schematic diagram of one example of the programmable delay circuit 110 according to one embodiment.

Figure 7A:
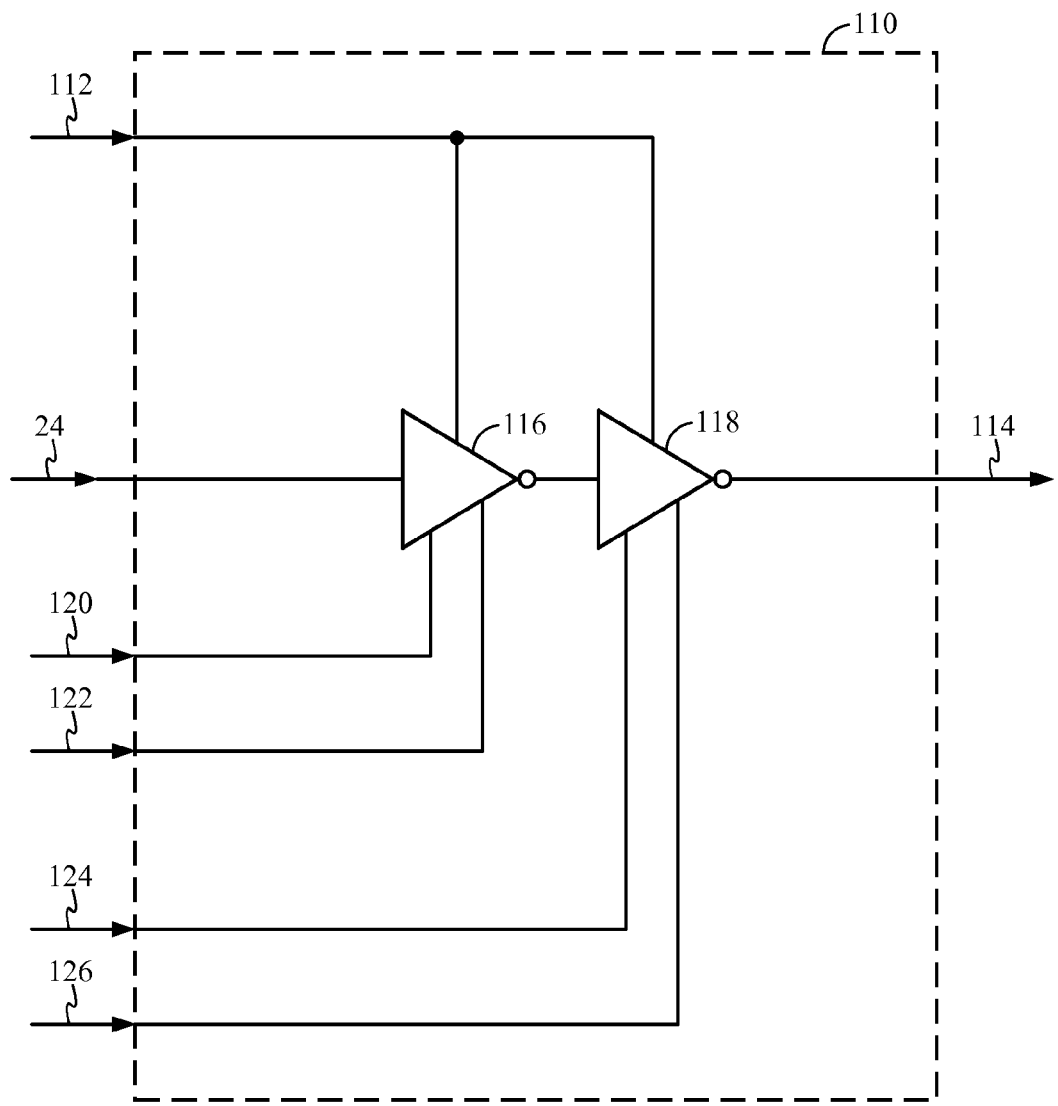
FIG. 7A is a schematic diagram of an exemplary programmable delay circuit associated with the exemplary clock adjustment circuit illustrated in FIG. 3A.

As illustrated in FIG. 7A, the programmable delay circuit 110 can receive a direct current (DC) supply signal 112 and the first clock signal 24, which has a programmable delay applied to the first secondary transition 86 of the first clock signal 24. The programmable delay circuit 110 can also receive a programmable delay applied to the second primary transition 84 of the first clock signal 24. In this manner, the programmable delay circuit 100 can provide an edge adjusted output signal 114, which is used by the clock edge adjustment circuit 36 to provide the second clock signal 28.

The schematic diagram of the programmable delay circuit 110 in the embodiment of FIG. 7A shows a first inverter 116 coupled in series with a second inverter 118. The first and second inverters 116, 118 receive the DC supply signal 112. The first inverter 116 receives and inverts the first clock signal 24 to feed the second inverter 118, which applies an inversion to provide the edge adjusted output signal 114, which is a delayed replica of the first clock signal 24, including whatever delays are provided by the first and second inverters 116, 118. The clock edge adjustment circuit 36 may provide first, second, third, and fourth delay enable signals 120, 122, 124, 126 to the programmable delay circuit 110. Specifically, the first inverter 116 receives the first and second delay enable signals 120, 122 to control delay though the first inverter 116, and the second inverter 118 receives the third and fourth delay enable signals 124, 126 to control delay through the second inverter 118. In one embodiment of the programmable delay circuit 110, the delay enable signals 120, 122, 124, 126 can be used to adjust a delay of the first secondary transition 86 of the first clock signal 24 only. In another embodiment of the programmable delay circuit 110, the delay enable signals 120, 122, 124, 126 can be used to adjust a delay of the second primary transition 84 of the first clock signal 24 only. In yet another embodiment of the programmable delay circuit 110, the delay enable signals 120, 122, 124, 126 can be used to adjust a delay of both the second primary transition 84 and the first secondary transition 86 of the first clock signal 24.

Alternate embodiments of the programmable delay circuit 110 may include any number of delay enable signals, such that each inverter 116, 118 has any number of delay enable signals. Additional embodiments of the programmable delay circuit 110 may include any even number of inverters coupled in series and may include any number of delay enable signals. Using an even number of inverters coupled in series provides an edge adjusted output signal 114, which is a delayed replica of the first clock signal 24. Other embodiments of the programmable delay circuit 110 may include any odd number of inverters coupled in series and may include any number of delay enable signals. Using an odd number of inverters coupled in series provides an edge adjusted output signal 114, which is a delayed inverted replica of the first clock signal 24.

Figure 7B:
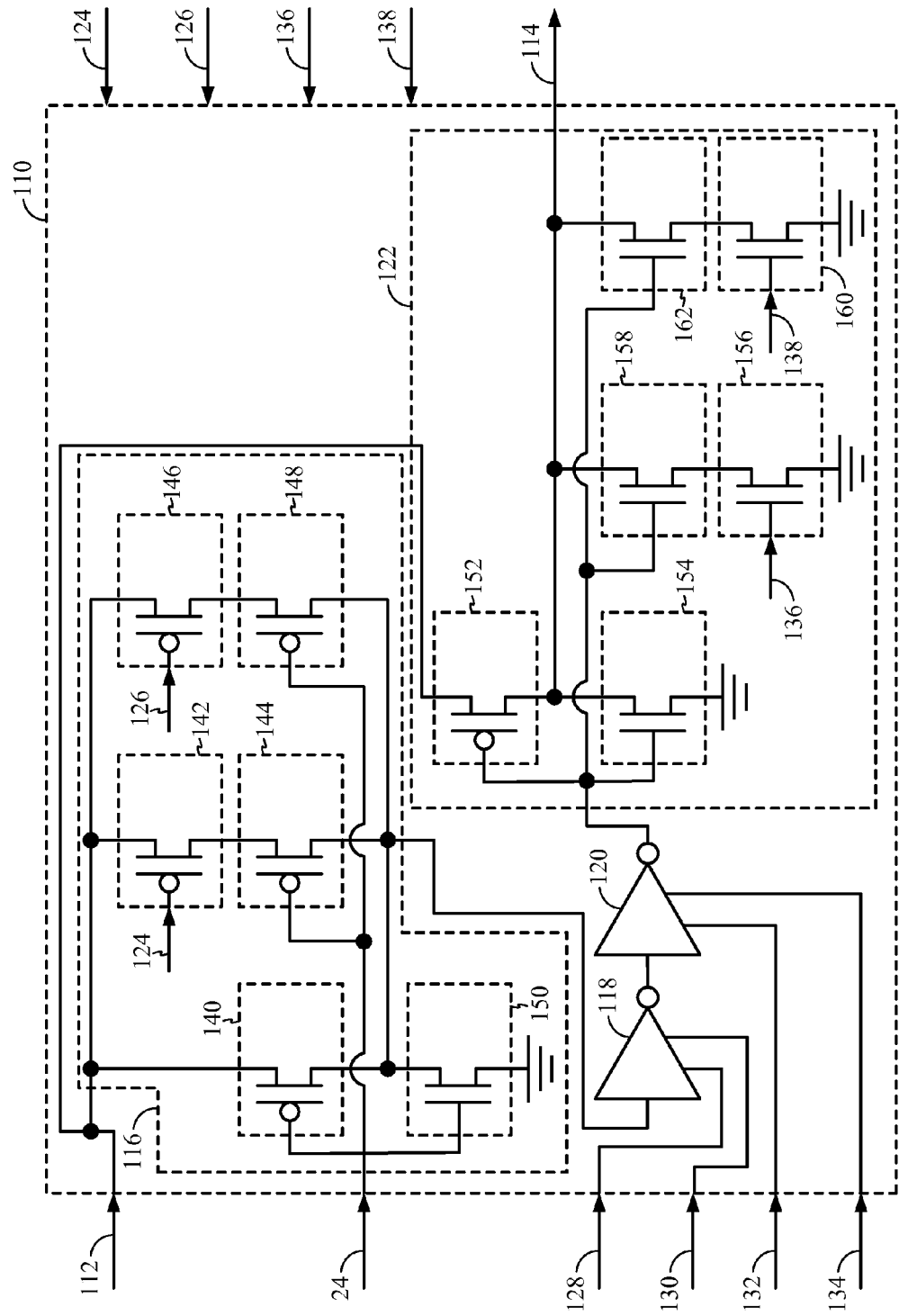
FIG. 7B is a schematic diagram of an additional exemplary programmable delay circuit associated with the exemplary clock adjustment circuit illustrated in FIG. 3A.

FIG. 7B is a schematic diagram of the programmable delay circuit 110 according to an alternate embodiment illustrating further details of the first and second inverters 116, 118 in FIG. 7A. Before discussing the operational details of the first and second inverters 116, 118 in FIG. 7B, the components and their connectivity are first introduced below. In this embodiment, the first inverter 116 includes a first PMOS transistor element 140, a second PMOS transistor element 142, a third PMOS transistor element 144, a first NMOS transistor element 146, a second NMOS transistor element 148, and a third NMOS transistor element 150. In this embodiment, the second inverter 118 includes a fourth PMOS transistor element 152, a fifth PMOS transistor element 154, a sixth PMOS transistor element 156, a fourth NMOS transistor element 158, a fifth NMOS transistor element 160, and a sixth NMOS transistor element 162.

Sources of the first, the second, the fourth, and the fifth NMOS transistor elements 146, 148, 158, 160 are coupled to ground. Sources of the first, the second, the fourth, and the fifth PMOS transistor elements 140, 142, 152, 154 are coupled together and receive the DC supply signal 112. Gates of the first and the third PMOS transistor elements 140, 144 and the first and the third NMOS transistor elements 146, 150 are coupled together and receive the first clock signal 24. Drains of the first and the third PMOS transistor elements 140, 144 and the first and the third NMOS transistor elements 146, 150 are coupled together and feed an input to the second inverter 118. A drain of the second PMOS transistor element 142 is coupled to a source of the third PMOS transistor element 144. A drain of the second NMOS transistor element 148 is coupled to a source of the third NMOS transistor element 150. A gate of the second PMOS transistor element 142 receives the first delay enable signal 120 and a gate of the second NMOS transistor element 148 receives the second delay enable signal 122.

Gates of the fourth and the sixth NMOS transistor elements 158, 162 and the fourth and the sixth PMOS transistor elements 152, 156 are coupled to the input of the second inverter 118. Drains of the fourth and the sixth NMOS transistor elements 158, 162 and the fourth and the sixth PMOS transistor elements 152, 156 are coupled together and provide the edge adjusted output signal 114. A drain of the fifth NMOS transistor element 160 is coupled to a source of the sixth NMOS transistor element 162. A source of the sixth PMOS transistor element 156 is coupled to a drain of the fifth PMOS transistor element 154. A gate of the second PMOS transistor element 154 receives the third delay enable signal 124, and a gate of the fifth NMOS transistor element 160 receives the fourth delay enable signal 126.

The first NMOS and PMOS transistor elements 146, 140 provide the inversion functionality of the first inverter 116, and the fourth NMOS and PMOS transistor elements 158, 152 provide the inversion functionality of the second inverter 118. The second and third NMOS transistor elements 148, 150 and the second and third PMOS transistor elements 142, 144 may be used to change the drive strength of the first inverter 116, and the fifth and sixth NMOS transistor elements 160, 162. The fifth and sixth PMOS transistor elements 154, 156 may be used to change the drive strength of the second inverter 118. Since the outputs of the first and second inverters 116, 118 are coupled to parasitic capacitances, changing the drive strengths of the first and second inverters 116, 118 may change delays of the first and second inverters 116, 118, respectively. Therefore, delays of the first and second inverters 116, 118 may be controlled using the delay enable signals 120, 122, 124, 126. As a result, the delay enable signals 120, 122, 124, 126 may be used to adjust a delay of the second primary transition 84, the first secondary transition 86, or both, as desired.

In this regard, in one operational mode, when the first, the second, the third, and the fourth delay enable signals 120, 122, 124, 126 are all in an inactive state, the second and the fifth PMOS transistor elements 142, 154 and the second and the fifth NMOS transistor elements 148, 160 are disabled. Therefore, only the first and the fourth PMOS transistor elements 140, 152 and the first and the fourth NMOS transistor elements 146, 158 are operational. Therefore, the drive strength of the first and second inverters 116, 118 is at a minimum, which results in a maximum delay through the series coupling of the first and the second inverters 116, 118. As a result, the maximum delay is applied to the first secondary transition 86 of the first clock signal 24 and the second primary transition 84 of the first clock signal 24.

In another operational mode when the first delay enable signal 120 is in an active state, the second PMOS transistor element 142 is enabled. Therefore, upon the first secondary transition 86 of the first clock signal 24, the first clock signal 24 transitions from a HIGH state to a LOW state, which causes both the first PMOS transistor element 140 and the third PMOS transistor element 144 to become enabled and provide drive strength, thereby reducing the delay that is applied to the first secondary transition 86. Further, when the fourth delay enable signal 126 is also in an active state, the fifth NMOS transistor element 160 is enabled. Therefore, upon the first secondary transition 86 of the first clock signal 24, the first clock signal 24 transitions from a HIGH state to a LOW state, which causes both the first PMOS transistor element 140 and the third PMOS transistor element 144 to become enabled and provide drive strength. As a result, the output of the first inverter 116 transitions from a LOW state to a HIGH state, which causes both the fourth NMOS transistor element 158 and the sixth NMOS transistor element 162 to become enabled and provide drive strength, thereby further reducing the delay that is applied to the first secondary transition 86. In general, the first and the fourth delay enable signals 120, 126 are used to control delay of the first secondary transition 86 of the first clock signal 24.

In another operational mode when the second delay enable signal 122 is in an active state, the second NMOS transistor element 148 is enabled. Therefore, upon the second primary transition 84 of the first clock signal 24, the first clock signal 24 transitions from a LOW state to a HIGH state, which causes both the first NMOS transistor element 146 and the third NMOS transistor element 150 to become enabled and provide drive strength, thereby reducing the delay that is applied to the second primary transition 84. Further, when the third delay enable signal 124 is also in an active state, the fifth PMOS transistor element 154 is enabled. Therefore, upon the second primary transition 84 of the first clock signal 24, the first clock signal 24 transitions from a LOW state to a HIGH state, which causes both the first NMOS transistor element 146 and the third NMOS transistor element 150 to become enabled and provide drive strength. As a result, the output of the first inverter 116 transitions from a HIGH state to a LOW state, which causes both the fourth PMOS transistor element 152 and the sixth PMOS transistor element 156 to become enabled and provide drive strength, thereby further reducing the delay that is applied to the second primary transition 84. In general, the second and the third delay enable signals 122, 124 are used to control delay of the second primary transition 84 of the first clock signal 24.

Alternate embodiments of the first and second inverters 116, 118 may omit the first and the fourth delay enable signals 120, 126, the second and the third PMOS transistor elements 142, 144, and the fifth and the sixth NMOS transistor elements 160, 162, such that only the delay of the first secondary transition 86 of the first clock signal 24 can be controlled. Additional embodiments of the first and second inverters 116, 118 may omit the second and the third delay enable signals 122, 124, the second and the third NMOS transistor elements 148, 150, and the fifth and the sixth PMOS transistor elements 154, 156, such that only the delay of the second primary transition 84 of the first clock signal 24 can be controlled.

Figure 8:
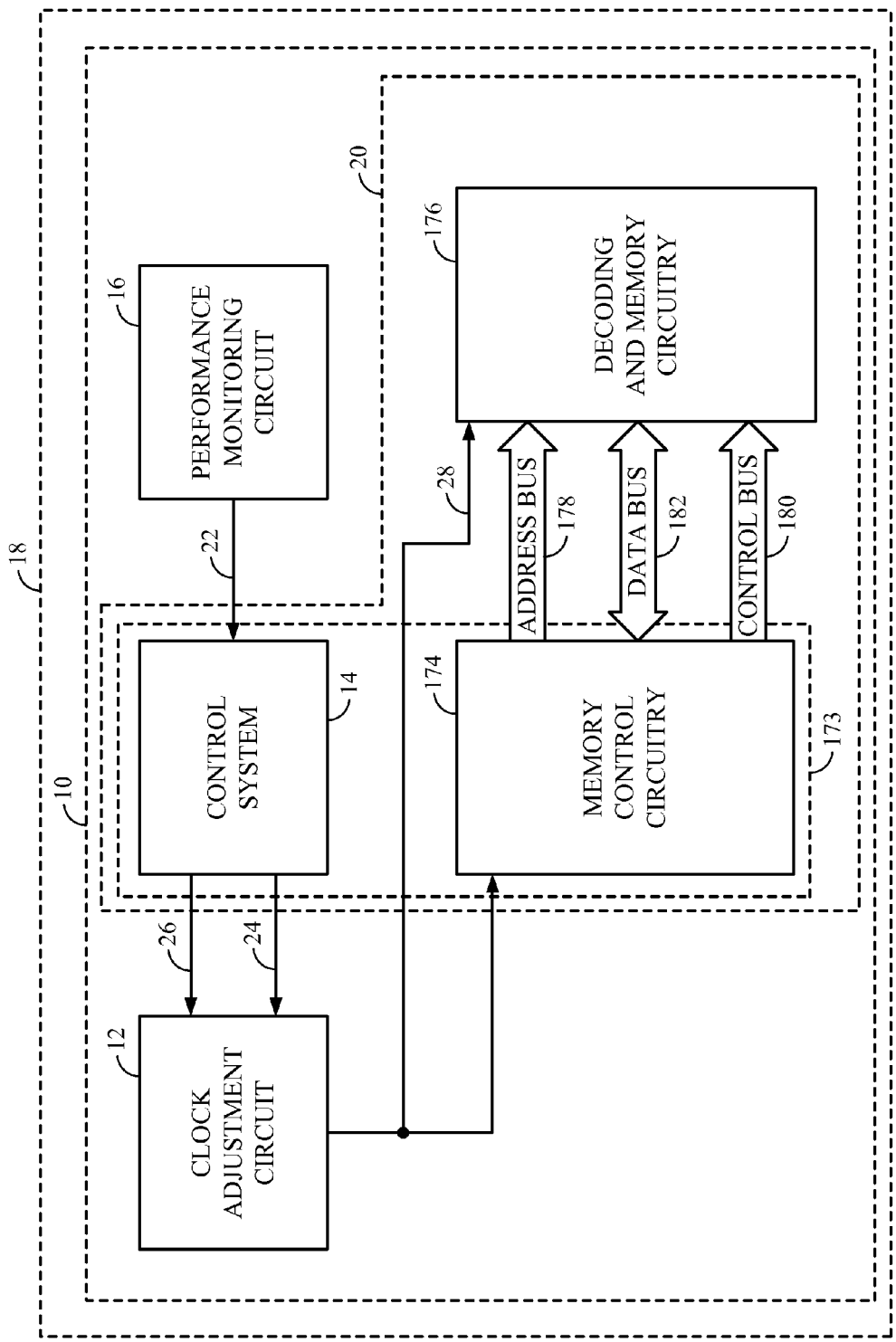
FIG. 8 is a block diagram of an exemplary functional circuit associated with the exemplary clock adjustment circuitry illustrated in FIG. 1.
Figure 9:
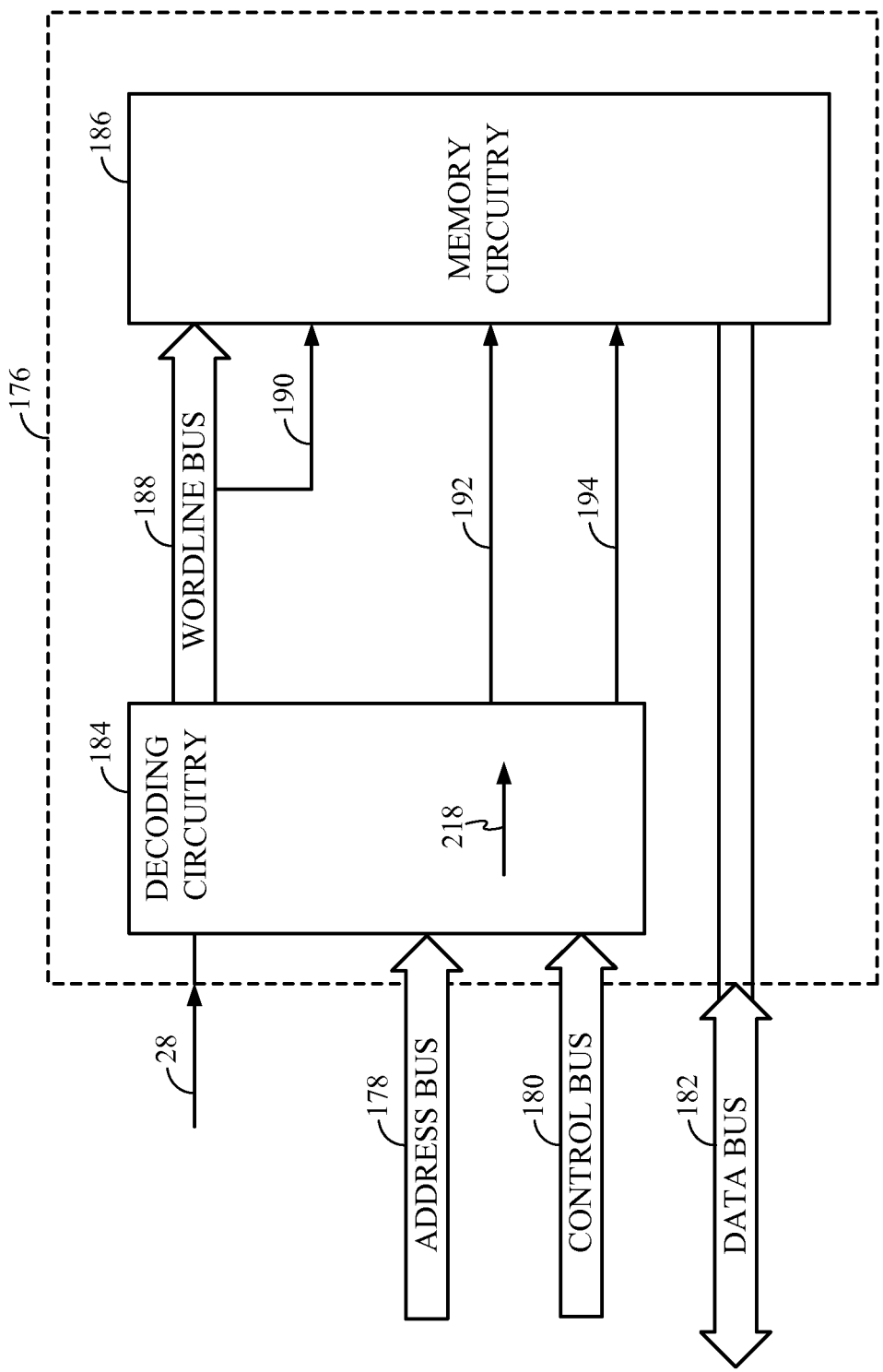
FIG. 9 is a block diagram of exemplary decoding and memory circuitry associated with the exemplary functional circuit illustrated in FIG. 7A.
Figure 10:
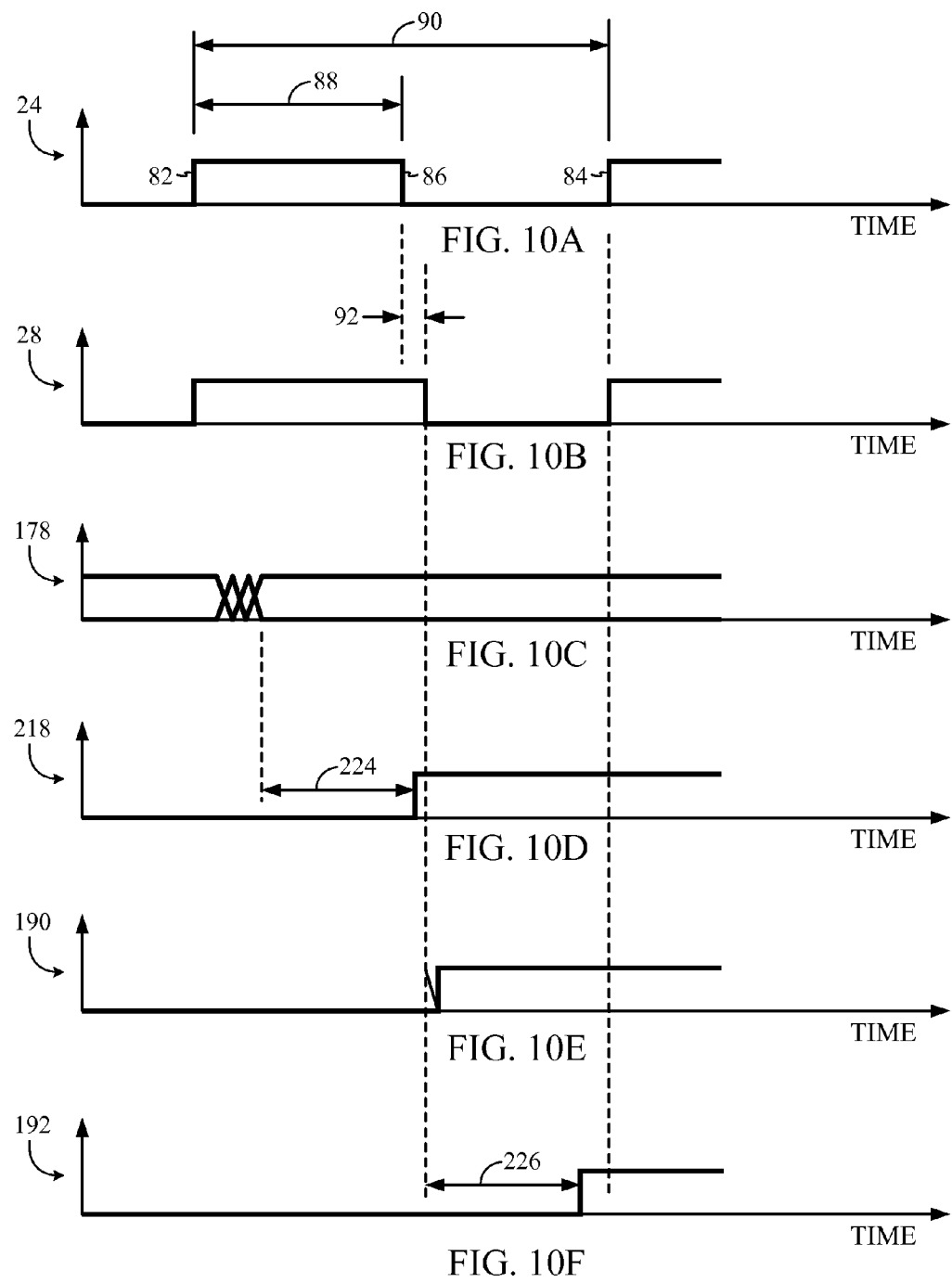
FIGS. 10A-10F are alternate exemplary timing diagrams of decoding and memory circuitry associated with the exemplary functional circuit illustrated in FIG. 7A.

The performance monitoring circuit 16 and clock adjustment circuit 12 can be employed to control and adjust a clock signal for any functional circuit desired. For example, FIGS. 8-10 show details of a computing system that utilizes the performance monitoring circuit 16 and the clock adjustment circuit 12 to measure performance characteristics associated with the computing system and then adjust a system clock, which is used by the computing system, based on the measured performance characteristics. In this regard, FIG. 8 is a block diagram of the functional circuit 20 illustrated in FIG. 1 according to one embodiment of the functional circuit 20. A central processing unit (CPU) 173 provides the control system 14 and memory control circuitry 174. The functional circuit 20 includes the CPU 173 and decoding and memory circuitry 176. Many computing circuits require access to some form of memory to obtain instructions, save and retrieve data, or the like. The memory access may be associated with addressing signals to specify a particular memory location, data signals to receive and send data, control signals to initiate and specify a type of transaction, and timing signals to synchronize and facilitate operations. The decoding and memory circuitry 176 has memory circuitry that includes multiple memory cells. Each memory cell stores a single bit of information. The memory cells are arranged to provide multiple memory words, wherein each memory word includes multiple bits that are provided by a group of memory cells. Typically, at least some of the bits of a memory word are accessed simultaneously.

The memory control circuitry 174 controls access to the memory cells in the decoding and memory circuitry 176. The memory control circuitry 174 provides multiple address signals to the decoding and memory circuitry 176 using an address bus 178 to select a particular address in the memory circuitry for the specific memory access. The memory control circuitry 174 may provide multiple memory control signals to the decoding and memory circuitry 176 using a control bus 180 to initiate and control the type of memory access, such as a memory read or a memory write. The memory control circuitry 174 and the decoding and memory circuitry 176 may each receive and use the second clock signal 28 for timing, synchronization, and to facilitate each specific memory access. Data signals are bidirectional signals that use a data bus 182 between the memory control circuitry 174 and the decoding and memory circuitry 176 for transferring data associated with each memory access.

In a memory read, data is transferred from the decoding and memory circuitry 176 to the memory control circuitry 174. In a memory write, data is transferred from the memory control circuitry 174 to the decoding and memory circuitry 176. The functional circuit 20 illustrated in FIG. 8 is an exemplary embodiment of the present disclosure and not intended to limit the scope of the present disclosure. Alternate embodiments of the functional circuit 20 may omit any or all of the signals shown in FIG. 8, may add other signals, may omit any or all of the blocks shown in FIG. 8, may add additional blocks, or any combination thereof.

The decoding and memory circuitry 176 illustrated in FIG. 8 may include decoding circuitry, which may decode an address for each memory access and control each memory access, and memory circuitry, which provides circuitry associated with each memory location. As such, FIG. 9 is a block diagram of the decoding and memory circuitry 176 illustrated in FIG. 8 according to one embodiment of the decoding and memory circuitry 176. The decoding and memory circuitry 176 includes decoding circuitry 184 and memory circuitry 186. The decoding circuitry 184 receives the second clock signal 28, the address signals using the address bus 178, and the control signals using the control bus 180. The decoding circuitry 184 provides multiple wordlines using a wordline bus 188 to the memory circuitry 186. The wordline bus 188 includes a $0^{th}$ wordline 190. Further, the decoding circuitry 184 provides a read bitline access signal 192 and a write bitline access signal 194 to the memory circuitry 186. The data bus 182 is used to transfer data between the memory control circuitry 174 (FIG. 8) and the memory circuitry 186.

For each memory access, the decoding circuitry 184 decodes the memory address encoded in the address signals provided by the address bus 178 to determine which specific wordline is associated with the memory location to be accessed. In one embodiment of the memory circuitry 186, each memory word in the memory circuitry 186 has a unique wordline. In alternate embodiments of the memory circuitry 186, two or more memory words in the memory circuitry 186 may be combined and associated with a unique wordline. In such an arrangement, multiple memory words may be accessed simultaneously with each memory access. The decoding circuitry 184 determines whether the access is a read or a write, based on the control signals provided by the control bus 180. Then, the decoding circuitry 184 asserts the specific wordline associated with the memory location to be accessed. For example, if the decoded address is located in a $0^{th}$ wordline in the memory circuitry 186, the decoding circuitry 184 may assert a $0^{th}$ wordline enable signal 218 based on decoding the address, and then assert the $0^{th}$ wordline 190 based on the $0^{th}$ wordline enable signal 218 and other control signals (not shown) in the decoding circuitry 184. The $0^{th}$ wordline enable signal 218 is internal to the decoding circuitry 184. Next, the decoding circuitry 184 asserts either the read bitline access signal 192 or the write bitline access signal 194, depending on whether the memory access is a read or a write. If the memory access is a read, when the read bitline access signal 192 is asserted, the memory cells associated with the asserted wordline output their contents onto read bitlines. The contents of the read bitlines are output onto the data signals using the data bus 182 to be received by the memory control circuitry 174 (FIG. 8).

If the memory access is a write, the memory control circuitry 174 (FIG. 8) sends data to be written onto the data signals using the data bus 182. Then, when the write bitline access signal 194 is asserted, the contents of the data from the data bus 182 are driven onto write bitlines in the memory circuitry 186, and the memory cells associated with the asserted wordline input the data from the write bitlines, thereby over-writing previous contents. Those skilled in the art will observe that the bitlines may serve for both reads and writes and that the memory bitlines may be differential, i.e., the logic value may be determined by their potential (voltage) difference. The decoding and memory circuitry 176 illustrated in FIG. 9 is an exemplary embodiment of the present disclosure and not intended to limit the scope of the present disclosure. Alternate embodiments of the decoding and memory circuitry 176 may omit any or all of the signals shown in FIG. 9, may add other signals, may omit any or all of the blocks shown in FIG. 9, may add additional blocks, or any combination thereof.

FIGS. 10A-10F are timing diagrams associated with the decoding and memory circuitry 176 illustrated in FIG. 8 to demonstrate the exemplary benefits of adjusting the first clock signal 24 during a $0^{th}$ wordline memory read of the memory circuitry 186 according to another embodiment of the decoding and memory circuitry 176. FIG. 10A is equivalent to FIG. 6A and is repeated for clarity. As previously mentioned, the first clock signal 24 has the first primary transition 82, the second primary transition 84, the first secondary transition 86, the first time delay 88 between the first primary transition 82 and the first secondary transition 86, and the second time delay 90 between the first primary transition 82 and the second primary transition 84.

FIG. 10B shows the second clock signal 28 with the secondary transition adjustment 92 applied to alter the first time delay 88. FIG. 10C shows the address signals provided by the address bus 178 (FIG. 8 and FIG. 9). FIG. 10D shows the $0^{th}$ wordline enable signal 218 (FIG. 9), which is provided by the decoding circuitry 184 (FIG. 9). FIG. 10E shows the $0^{th}$ wordline 190, which is provided by the decoding circuitry 184 (FIG. 9). FIG. 10F shows the read bitline access signal 192, which is provided by the decoding circuitry 184 (FIG. 9).

The first primary transition 82 gates the start of a memory read to the memory circuitry 186 (FIG. 9). The first secondary transition 86 as adjusted by the secondary transition adjustment 92 gates the start of the wordline enable portion of the memory read cycle. Sometime after the first primary transition 82, the memory control circuitry 174 (FIG. 8) provides a stable address on the address signals associated with the address bus 178 as illustrated in FIG. 10C. The decoding circuitry 184 (FIG. 9) decodes the address and provides wordline enable signals for all of the wordlines, including the $0^{th}$ wordline enable signal 218 (FIG. 9), which is associated with the $0^{th}$ wordline 190 (FIG. 9). For proper operation, the wordlines may be required to exhibit "one hot" behavior, which means all of the wordline enable signals, including the $0^{th}$ wordline enable signal 218, must be stable before a global wordline enable signal (not shown) transitions to an active state, which is based on the first secondary transition 86 as adjusted by the secondary transition adjustment 92. Otherwise, multiple wordlines may be active simultaneously, which may result in memory corruption. However, since an address-to-wordline enable signal delay 224 does not push the decoding of the $0^{th}$ wordline enable signal 218 beyond the first secondary transition 86 as adjusted by the secondary transition adjustment 92 as illustrated in FIG. 10D, memory corruption will not result. In such a situation, gating of the $0^{th}$ wordline 190 is based on the global wordline enable signal (not shown), which is gated by the first secondary transition 86 as adjusted by the secondary transition adjustment 92 as illustrated in FIG. 10E. During the memory read cycle, the read bitline access signal 192 (FIG. 9) transitions to the active state, which is a HIGH state in the presented embodiment, after a time delay 226 provided by delay circuitry (not shown).

The clock adjustment system according to the designs and methods discussed herein may be included or integrated in the semiconductor die 18, in an integrated circuit, and/or device, including an electronic device and/or processor-based device or system. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

Figure 11:
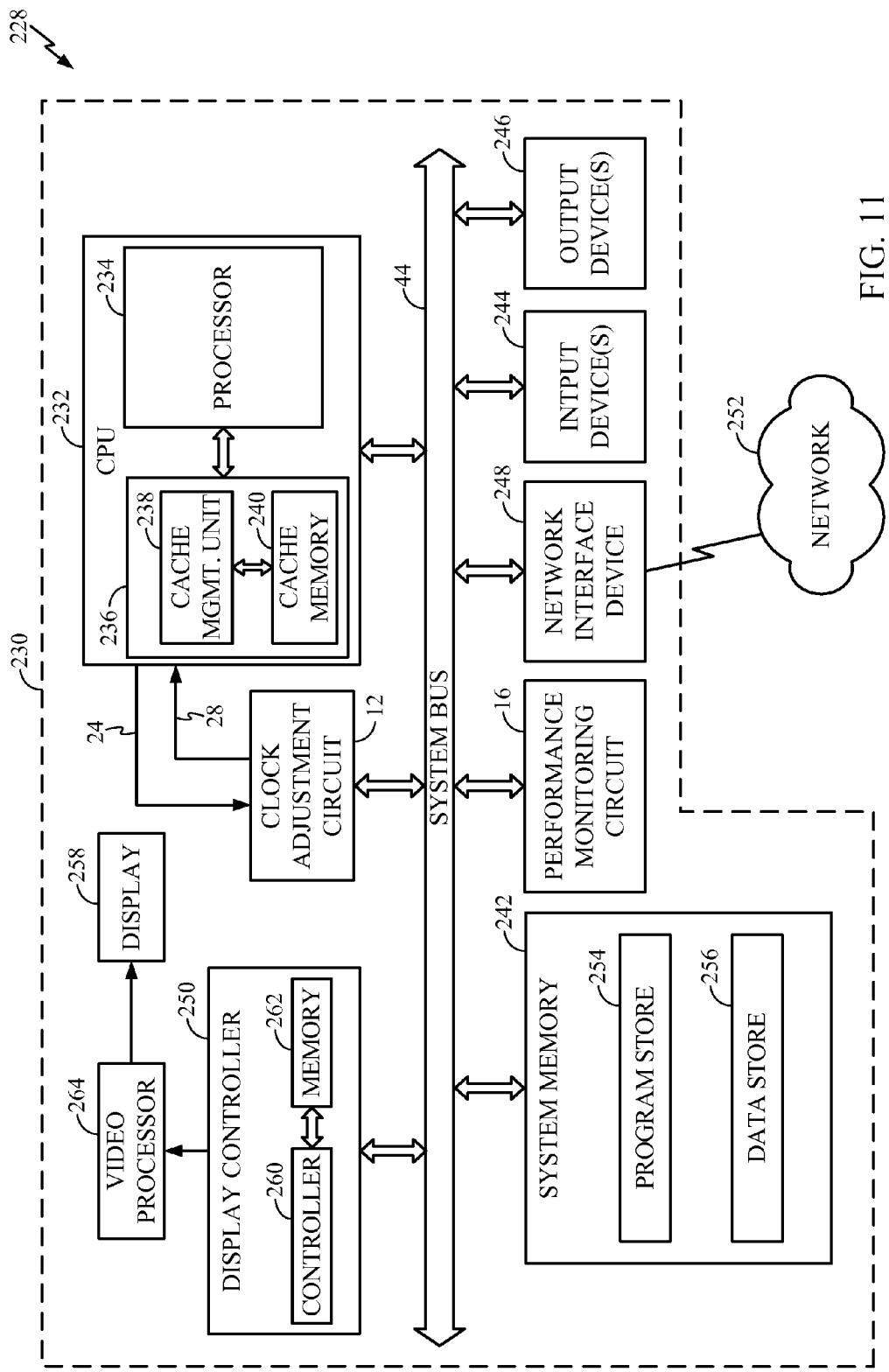
FIG. 11 is a block diagram of an exemplary processor-based system.

In this regard, FIG. 11 illustrates a processor-based system 228 that may employ performance monitoring circuit 16, a clock adjustment circuit 12, and related circuits described above. The processor-based system 228 may be included in an electronic device 230. In this example, the processor-based system 228 includes a central processing unit (CPU) 232 that includes a processor 234 and an integrated cache system 236. The cache system 236 includes a cache management unit 238 that controls access to a cache memory 240 accessible to the processor 234 for rapid access to temporary storage for frequently accessed data. The performance monitoring circuit 16 may measure performance associated with the processor-based system 228. The clock adjustment circuit 12 may receive the first clock signal 24 from the CPU 232 and may provide the second clock signal 28 to the CPU 232 based on adjusting the first clock signal 24. The clock adjustments may be based on the performance measurements obtained using the performance monitoring circuit 16. The CPU 232 is coupled to the system bus 44, which interconnects the other devices included in the processor-based system 228. As is well known, the CPU 232 communicates with these other devices by exchanging address, control, and data information over the system bus 44. These devices may include any types of devices. As illustrated in FIG. 11, these devices may include system memory 242, one or more input devices 244, one or more output devices 246, a network interface device 248, and a display controller 250, as examples.

The one or more input devices 244 may include any type of input device, including but not limited to input keys, switches, voice processors, etc. The one or more output devices 246 may include any type of output device, including but not limited to audio, video, other visual indicators, etc. The network interface device 248 may be any device configured to allow exchange of data to and from a network 252. The network 252 may be any type of network, including but not limited to a wired or wireless network, private or public network, a local area network (LAN), a wide local area network (WLAN), and the Internet. The network interface device 248 may support any type of communication protocol desired.

The CPU 232 may also access the system memory 242 over the system bus 44. The system memory 242 may include circuits and methods previously described above to access the system memory 242. The system memory 242 may include static memory and/or dynamic memory. The system memory 242 may include a program store 254 and a data store 256 for the CPU 232. The CPU 232 may also access the display controller 250 over the system bus 44 to control information sent to a display 258. The display controller 250 may include a memory controller 260 and memory 262 to store data to be sent to the display 258 in response to communications with the CPU 232. The display controller 250 sends information to the display 258 to be displayed via a video processor 264, which processes the information to be displayed into a format suitable for the display 258. The display 258 may include any type of display, including but not limited to a cathode ray tube (CRT), a liquid crystal display (LCD), a plasma display, etc.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium is coupled to the processor such that a processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit for adjusting a clock signal having a first transition from a first logic level to a second logic level, a second transition from the second logic level to the first logic level, and a third transition from the first logic level to the second logic level in a period, the circuit comprising:
   a performance monitoring circuit provided in a semiconductor die and configured to measure at least one performance characteristic associated with a functional circuit in the semiconductor die and generate a measured at least one performance characteristic; and
   a clock adjustment circuit configured to receive the measured at least one performance characteristic and to adjust occurrence of one of the second transition and the third transition or occurrences of both of the second transition and the third transition of the clock signal based on the measured at least one performance characteristic to generate an adjusted clock signal having a primary transition from the first logic level to the second logic level and a secondary transition from the second logic level to the first logic level.

2. The circuit of claim 1, wherein the adjusted clock signal is provided to the functional circuit.

3. The circuit of claim 1, wherein the clock adjustment circuit comprises:
   a programmable delay circuit configured to receive the clock signal and delay enable signals and to adjust occurrence of one of the second transition and the third transition or occurrences of both of the second transition and the third transition of the clock signal based on the delay enable signals to generate the adjusted clock signal.

4. The circuit of claim 3, wherein the programmable delay circuit comprises two inverters, each of the inverters is configured to receive at least two of the delay enable signals.

5. The circuit of claim 3, wherein the clock adjustment circuit further comprises a clock edge adjustment circuit configured to receive the clock signal and the measured at least one performance characteristic and to generate the delay enable signals.

6. The circuit of claim 1, further comprising a control system configured to:
   receive performance information from the performance monitoring circuit based on the measured at least one performance characteristic; and
   provide clock adjustment information to the clock adjustment circuit based on the performance information, wherein the adjusted clock signal is further based on the clock adjustment information.

7. The circuit of claim 6, wherein the performance monitoring circuit comprises digital circuitry, wherein the measured at least one performance characteristic is associated with performance of the digital circuitry.

8. The circuit of claim 7, wherein the digital circuitry comprises a first ring oscillator circuit.

9. The circuit of claim 8, wherein the digital circuitry further comprises a second ring oscillator circuit and a third ring oscillator circuit, wherein the first ring oscillator circuit comprises at least one low threshold voltage (LVT) field effect transistor (FET), the second ring oscillator circuit comprises at least one high threshold voltage (HVT) FET, and the third ring oscillator circuit comprises at least one nominal threshold voltage (NVT) FET.

10. The circuit of claim 1, wherein the functional circuit comprises decoding and memory circuitry configured to receive the adjusted clock signal, wherein a memory read to the decoding and memory circuitry is based on the adjusted clock signal.

11. The circuit of claim 10, wherein the primary transition gates a start of the memory read to the decoding and memory circuitry, and wherein the secondary transition gates a wordline enable signal to the decoding and memory circuitry during the memory read.

12. The circuit of claim 1, wherein the circuit is integrated in a device selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

13. A circuit for adjusting a clock signal having a first transition from a first logic level to a second logic level, a second transition from the second logic level to the first logic level, and a third transition from the first logic level to the second logic level in a period, the circuit comprising:
   means provided in a semiconductor die for measuring at least one performance characteristic associated with a functional circuit in the semiconductor die and generating a measured at least one performance characteristic; and
   means for adjusting occurrence of one of the second transition and the third transition or occurrences of both of the second transition and the third transition of the clock signal based on the measured at least one performance characteristic to generate an adjusted clock signal having a primary transition from the first logic level to the second logic level and a secondary transition from the second logic level to the first logic level.

14. A method for adjusting a clock signal having a first transition from a first logic level to a second logic level, a second transition from the second logic level to the first logic level, and a third transition from the first logic level to the second logic level in a period, the method comprising:

measuring at least one performance characteristic associated with a functional circuit in a semiconductor die using a performance monitoring circuit in the semiconductor die; and adjusting occurrence of one of the second transition and the third transition or occurrences of both of the second transition and the third transition of the clock signal based on the measured at least one performance characteristic to generate an adjusted clock signal having a primary transition from the first logic level to the second logic level and a secondary transition from the second logic level to the first logic level.

15. The method of claim 14, further comprising providing the adjusted clock signal to the functional circuit.

16. The method of claim 14, wherein:

measuring the at least one performance characteristic comprises:

reading counter values from a plurality of ring oscillator circuits; and averaging the counter values to create at least one average counter value; and adjusting occurrence of one of the second transition and the third transition or occurrences of both of the second transition and the third transition of the clock signal comprises:

using a look-up table associating the counter values with delay adjustments to determine at least one needed delay adjustment based on the at least one average counter value; and adjusting occurrence of one of the second transition and the third transition or occurrences of both of the second transition and the third transition of the clock signal to generate the adjusted clock signal based on the at least one needed delay adjustment.

17. The method of claim 14, wherein measuring the at least one performance characteristic is directed by a control system.

18. A semiconductor die, comprising a performance monitoring circuit configured to measure at least one performance characteristic associated with a functional circuit in the semiconductor die, coupled to a clock adjustment circuit configured to adjust a clock signal based on the measured at least one performance characteristic to provide an adjusted clock signal to the functional circuit, the clock signal having a first transition from a first logic level to a second logic level, a second transition from the second logic level to the first logic level, and a third transition from the first logic level to the second logic level in a period, the clock adjustment circuit adjusting occurrence of one of the second transition and the third transition or occurrences of both of the second transition and the third transition of the clock signal based on the measured at least one performance characteristic to generate the adjusted clock signal having a primary transition from the first logic level to the second logic level and a secondary transition from the second logic level to the first logic level.

19. The semiconductor die of claim 18, wherein the clock adjustment circuit comprises:

a programmable delay circuit configured to receive the clock signal and delay enable signals and to adjust occurrence of one of the second transition and the third transition or occurrences of both of the second transition and the third transition of the clock signal based on the delay enable signals to generate the adjusted clock signal.

20. The semiconductor die of claim 19, wherein the clock adjustment circuit further comprises a clock edge adjustment circuit configured to receive the clock signal and the measured at least one performance characteristic and to generate the delay enable signals.

21. The semiconductor die of claim 20, wherein the functional circuit comprises decoding and memory circuitry configured to receive the adjusted clock signal, wherein a memory read to the decoding and memory circuitry is based on the adjusted clock signal.

22. The semiconductor die of claim 21, wherein the primary transition gates a start of the memory read to the decoding and memory circuitry, and wherein the secondary transition gates a wordline enable signal to the decoding and memory circuitry during the memory read.

23. The semiconductor die of claim 18, further comprising the clock adjustment circuit.

* * * * *